US012533767B2

(12) United States Patent
Bubel et al.

(10) Patent No.: US 12,533,767 B2
(45) Date of Patent: Jan. 27, 2026

(54) GRIND WHEEL DESIGN FOR LOW EDGE-ROLL GRINDING

(71) Applicant: Wolfspeed, Inc., Durham, NC (US)

(72) Inventors: Simon Bubel, Carrboro, NC (US); Robert Leonard, Raleigh, NC (US)

(73) Assignee: WOLFSPEED, INC., Durham, NC (US)

( * ) Notice: Subject to any disclaimer, the term of this patent is extended or adjusted under 35 U.S.C. 154(b) by 0 days.

(21) Appl. No.: 18/598,825

(22) Filed: Mar. 7, 2024

(65) Prior Publication Data

US 2025/0282016 A1 Sep. 11, 2025

(51) Int. Cl.

| | |
|---|---|
| ***B24B 7/22*** | (2006.01) |
| ***B24B 37/16*** | (2012.01) |
| ***H01L 21/04*** | (2006.01) |

(52) U.S. Cl.

CPC .............. *B24B 7/228* (2013.01); *B24B 37/16* (2013.01); *H01L 21/0445* (2013.01)

(58) Field of Classification Search

CPC ......... B24B 7/228; B24B 37/04; B24B 37/10; B24B 37/12; B24B 37/16; B24B 53/017; B24B 53/06; B24B 53/12; B24B 53/14; H01L 21/30625; H01L 21/0445

USPC ...... 451/41, 56, 63, 443, 285, 287, 290, 548

See application file for complete search history.

(56) References Cited

U.S. PATENT DOCUMENTS 2,867,063 A * 1/1959 Metzger ................... B24D 7/10 451/548
4,149,343 A * 4/1979 Feldmeier ............. B24B 37/042 451/63
5,964,646 A * 10/1999 Kassir ..................... B24B 41/06 451/63
6,042,459 A * 3/2000 Honda ...................... B24B 7/16 451/291
6,050,880 A * 4/2000 Kato ....................... B24B 7/228 451/388

(Continued)

FOREIGN PATENT DOCUMENTS

CN 101200050 B 6/2008
CN 114055270 A 2/2022

(Continued)

OTHER PUBLICATIONS

Son et al., "Contact-Area-Changeable CMP Conditioning for Enhancing Pad Lifetime", Applied Sciences MDPI, vol. 11, No. 3521, Apr. 14, 2021, pp. 1-15.

(Continued)

*Primary Examiner* — Brian D Keller
*Assistant Examiner* — Marcel T Dion
(74) *Attorney, Agent, or Firm* — Dority & Manning, P.A.

(57) ABSTRACT

Grinding systems and methods for semiconductor workpieces are provided. In one example, a grinding system includes a workpiece support operable to support a semiconductor workpiece and rotate the semiconductor workpiece about a first axis. The grinding system further includes a grind wheel operable to rotate about a second axis. The grind wheel has a plurality of grinding teeth arranged in a grinding ring on the grind wheel. A radius of the grinding ring is less than or equal to a radius of the semiconductor workpiece (e.g., such that an effective gap ratio between grinding teeth on the grind wheel are reduced).

19 Claims, 15 Drawing Sheets

(56) References Cited

U.S. PATENT DOCUMENTS

| | | | | |
|---|---|---|---|---|
| 6,179,695 | B1 * | 1/2001 | Takahashi | B24B 41/047 451/271 |
| 6,217,433 | B1 * | 4/2001 | Herrman | B24D 7/06 451/268 |
| 6,224,473 | B1 * | 5/2001 | Miller | B24D 7/18 451/529 |
| 6,887,130 | B2 * | 5/2005 | Lee | B24B 37/26 451/14 |
| 7,108,583 | B1 * | 9/2006 | Heilmaier | B24B 37/042 451/287 |
| 7,601,051 | B2 * | 10/2009 | Tanaka | B24D 7/06 451/63 |
| 7,758,402 | B2 | 7/2010 | Yoshida et al. | |
| 8,025,556 | B2 * | 9/2011 | Kajiyama | B24B 27/0076 451/41 |
| 8,753,175 | B2 * | 6/2014 | Chen | B24B 45/00 451/342 |
| 9,238,288 | B2 * | 1/2016 | Sugiya | B24B 1/00 |
| 10,086,499 | B2 * | 10/2018 | Mejean | B24D 7/06 |
| 10,112,285 | B2 * | 10/2018 | Fujiya | B24B 55/02 |
| 10,576,585 | B1 | 3/2020 | Donofrio et al. | |
| 11,219,966 | B1 | 1/2022 | Donofrio et al. | |
| 11,273,534 | B2 * | 3/2022 | Pekija | B24B 7/228 |
| 11,654,596 | B2 | 5/2023 | Bubel et al. | |
| 11,872,669 | B2 * | 1/2024 | Moriya | B24B 55/04 |
| 11,901,181 | B2 | 2/2024 | Donofrio et al. | |
| 11,980,993 | B2 * | 5/2024 | Suzuki | B24B 37/27 |
| 2001/0011004 | A1 * | 8/2001 | Yamaguchi | B24D 7/06 451/548 |
| 2002/0102920 | A1 * | 8/2002 | Vogtmann | B24B 7/228 451/287 |
| 2006/0009134 | A1 * | 1/2006 | Katayama | B24D 7/18 451/41 |
| 2007/0141955 | A1 * | 6/2007 | Masuda | B24B 27/0076 451/41 |
| 2009/0186562 | A1 * | 7/2009 | Kajiyama | B24B 37/042 451/57 |
| 2012/0171939 | A1 * | 7/2012 | Jiang | B24B 57/02 451/446 |
| 2015/0258657 | A1 * | 9/2015 | Su | H01L 24/19 451/6 |
| 2016/0256982 | A1 * | 9/2016 | Mejean | B24D 7/06 |
| 2019/0067018 | A1 | 2/2019 | Takenouchi et al. | |
| 2019/0134782 | A1 * | 5/2019 | Tateishi | B24D 7/06 |
| 2022/0063053 | A1 | 3/2022 | Genozono | |
| 2022/0063059 | A1 * | 3/2022 | Saito | B24B 7/228 |
| 2022/0314393 | A1 * | 10/2022 | Suzuki | B24B 7/04 |
| 2023/0158640 | A1 * | 5/2023 | Nagami | B24D 3/16 451/41 |

FOREIGN PATENT DOCUMENTS

| | | |
|---|---|---|
| JP | S59102575 A | 6/1984 |
| JP | 2010094789 A | 4/2010 |

OTHER PUBLICATIONS

Zhu et al., “Grinding Marks in Back Grinding of Wafer with Outer Rim”, Institute of Mechanical Engineers, Journal of Mechanical Engineering Science, Jan. 27, 2020, pp. 1-12.

Disco, “Chemical-Free Stress Relief Fry Polishing Wheel”, DP08 Series Product Information, https://www.discousa.com/eg/products/dry_whee;/dp08.html, available at least as early as Feb. 14, 2019, retrieved on Mar. 7, 2024, 2 pages.

International Search Report and Written Opinion for Application No. PCT/US2025/018723, mailed Jul. 10, 2025, 18 pages.

Rena, “ACE Advanced Electrochemical Etching for SiC-Wafer”, https://www.rena.com/en/technology/innovations/sic-electrochemical-etching, available at least as early as Feb. 25, 2024, retrieved on Mar. 7, 2024, 5 pages.

* cited by examiner

GRIND WHEEL DESIGN FOR LOW EDGE-ROLL GRINDING

FIELD

The present disclosure relates generally to semiconductor workpieces and fabrication processes for semiconductor workpieces, such as semiconductor wafers used in semiconductor device fabrication.

BACKGROUND

Power semiconductor devices are used to carry large currents and support high voltages. A wide variety of power semiconductor devices are known in the art including, for example, transistors, diodes, thyristors, power modules, discrete power semiconductor packages, and other devices. For instance, example semiconductor devices may be transistor devices such as Metal Oxide Semiconductor Field Effect Transistors ("MOSFET"), Schottky diodes, bipolar junction transistors ("BJTs"), Insulated Gate Bipolar Transistors ("IGBT"), Gate Turn-Off Transistors ("GTO"), junction field effect transistors ("JFET"), high electron mobility transistors ("HEMT") and other devices. Example semiconductor devices may be diodes, such as Schottky diodes or other devices. Example semiconductor devices may be power modules, which may include one or more power devices and other circuit components and can be used, for instance, to dynamically switch large amounts of power through various components, such as motors, inverters, generators, and the like. These semiconductor devices may be fabricated from wide bandgap semiconductor materials, such as silicon carbide ("SiC") and/or Group III nitride-based semiconductor materials. The fabrication process may require processing of wide bandgap semiconductor wafers, such as silicon carbide semiconductor wafers.

SUMMARY

Aspects and advantages of embodiments of the present disclosure will be set forth in part in the following description, or may be learned from the description, or may be learned through practice of the embodiments.

One example aspect of the present disclosure is directed to a grinding system for a semiconductor workpiece. The grinding system includes a workpiece support operable to support a semiconductor workpiece and rotate the semiconductor workpiece about a first axis. The grinding system further includes a grind wheel operable to rotate about a second axis. The grind wheel has a plurality of grinding teeth arranged in a grinding ring on the grind wheel. A radius of the grinding ring is less than or equal to a radius of the semiconductor workpiece.

Another example aspect of the present disclosure is directed to a grinding system for a semiconductor workpiece. The grinding system includes a workpiece support operable to support a semiconductor workpiece and rotate the semiconductor workpiece about a first axis. The grinding system further includes a grind wheel operable to rotate about a second axis. The grind wheel has a plurality of grinding teeth arranged in a grinding ring on the grind wheel. Each of the plurality of grinding teeth comprises a grind surface, the grind surface having a first edge and a second edge forming an acute angle.

Another example aspect of the present disclosure is directed to a grinding system for a semiconductor workpiece. The grinding system includes a workpiece support operable to support a semiconductor workpiece and rotate the semiconductor workpiece about a first axis. The grinding system further includes a grind wheel operable to rotate about a second axis, wherein the grind wheel has a continuous grinding ring on the grind wheel, the continuous grinding ring comprising an abrasive containing material.

Another example aspect of the present disclosure is directed to a grinding system for a semiconductor workpiece. The grinding system includes a workpiece support operable to support a semiconductor workpiece and rotate the semiconductor workpiece about a first axis. The grinding system further includes a grind wheel operable to rotate about a second axis, wherein the grind wheel has a plurality of grinding teeth arranged in a grinding ring on the grind wheel. An effective gap ratio between the plurality of grinding teeth at an edge of the semiconductor workpiece is about 0.8 or less.

Another example aspect of the present disclosure is directed to a method for grinding a surface of a semiconductor workpiece. The method includes providing a semiconductor workpiece on a workpiece support, the workpiece support rotatable about a first axis. The method further includes providing a surface of the semiconductor workpiece against a grinding ring on a grind wheel, the grind wheel rotatable about a second axis. The method further includes rotating one or more of the grind wheel or the workpiece support to implement a grinding operation on the semiconductor workpiece. An effective gap ratio between a plurality of grinding teeth at an edge of the semiconductor workpiece is about 0.8 or less.

Another example aspect of the present disclosure is directed to a method for grinding a surface of a semiconductor workpiece. The method includes providing a semiconductor workpiece on a workpiece support, the workpiece support rotatable about a first axis. The method further includes providing a surface of the semiconductor workpiece against a continuous grinding ring on a grind wheel, the grind wheel rotatable about a second axis, the continuous grinding ring comprising an abrasive containing material. The method further includes rotating one or more of the grind wheel or the workpiece support to implement a grinding operation on the semiconductor workpiece.

Another example aspect of the present disclosure is directed to a Blanchard ground semiconductor wafer. The semiconductor wafer includes a silicon carbide surface. The semiconductor wafer has an edge roll over 10 millimeters from a peripheral edge of the semiconductor wafer of less than about 0.7 microns.

These and other features, aspects and advantages of various embodiments will become better understood with reference to the following description and appended claims. The accompanying drawings, which are incorporated in and constitute a part of this specification, illustrate embodiments of the present disclosure and, together with the description, explain the related principles.

BRIEF DESCRIPTION OF THE DRAWINGS

Detailed discussion of embodiments directed to one of ordinary skill in the art are set forth in the specification, which refers to the appended figures, in which.

DETAILED DESCRIPTION

Figure 1:
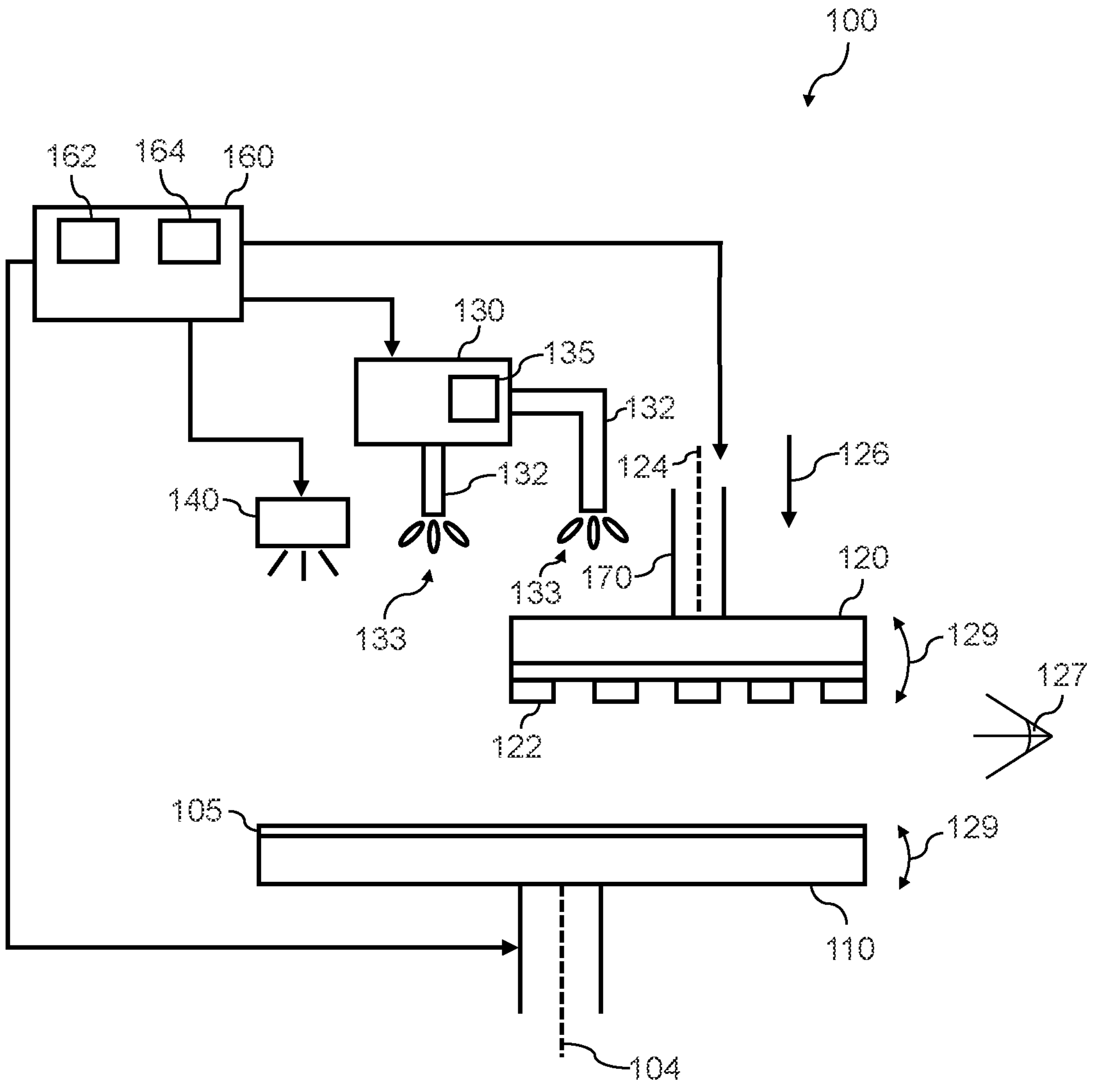
FIG. 1 depicts an example grinding system for grinding a silicon carbide semiconductor wafer according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Power semiconductor devices are often fabricated from wide bandgap semiconductor materials, such as silicon carbide or Group III-nitride based semiconductor materials (e.g., gallium nitride). Herein, a wide bandgap semiconductor material refers to a semiconductor material having a bandgap greater than 1.40 eV. Aspects of the present disclosure are discussed with reference to silicon carbide-based semiconductor structures as wide bandgap semiconductor structures. Those of ordinary skill in the art, using the disclosures provided herein, will understand that the power semiconductor devices according to example embodiments of the present disclosure may be used with any semiconductor material, such as other wide bandgap semiconductor materials, without deviating from the scope of the present disclosure. Example wide bandgap semiconductor materials include silicon carbide and the Group III-nitrides.

Power semiconductor devices may be fabricated using epitaxial layers formed on a semiconductor workpiece, such as a silicon carbide semiconductor wafer. Power semiconductor device fabrication processes may include surface processing operations that are performed on the silicon carbide semiconductor wafer to prepare one or more surfaces of the silicon carbide semiconductor wafer for later processing steps, such as surface implantation, formation of epitaxial layers, metallization, etc.). Example surface processing operations may include grinding operations, lapping operations, and polishing operations.

Aspects of the present disclosure are discussed with reference to a semiconductor workpiece that is a semiconductor wafer that includes silicon carbide ("silicon carbide semiconductor wafer") for purposes of illustration and discussion. Those of ordinary skill in the art, using the disclosures provided herein, will understand that aspects of the present disclosure can be used with other semiconductor workpieces, such as other wide bandgap semiconductor workpieces. Other semiconductor workpieces may include carrier substrates, ingots, boules, polycrystalline substrates, monocrystalline substrates, bulk materials having a thickness of greater than 1 mm, such as greater than about 5 mm, such as greater than about 10 mm, such as greater than about 20 mm, such as greater than about 50 mm, such as greater than about 100 mm, to 200 mm, etc.

Grinding is a material removal process that is used to remove material from the semiconductor wafer. Grinding may be used to reduce a thickness of a semiconductor wafer. Grinding typically involves exposing the semiconductor wafer to an abrasive containing surface, such as grind teeth on a grind wheel. Grinding may remove material of the semiconductor wafer through engagement with the abrasive surface.

Lapping is a precision finishing process that uses a loose abrasive in slurry form. The slurry typically includes coarser particles (e.g., largest dimension of the particles being greater than about 100 microns) to remove material from the semiconductor wafer. Lapping typically does not include engaging the semiconductor wafer with an abrasive-containing surface on the lapping tool (e.g., a wheel or disc having an abrasive-containing surface). Instead, the semiconductor wafer typically comes into contact with a lapping plate or a tile usually made of metal. Lapping typically provides better planarization of the semiconductor wafer relative to grinding.

Polishing is a process to remove imperfections and create a smooth surface with a low surface roughness. Polishing may be performed using a slurry and a polishing pad. The slurry typically includes finer particles relative to lapping, but coarser particles relative to chemical mechanical planarization (CMP). Polishing typically provides better planarization of the semiconductor wafer relative to grinding.

CMP is a type of fine or ultrafine polishing, typically used to produce a smoother surface ready, for instance, for epitaxial growth of layers on the semiconductor wafer. CMP may be performed chemically and/or mechanically to remove imperfections and to create a smooth and flat surface with low surface roughness. CMP typically involves changing the material of the semiconductor through a chemical process (e.g., oxidation) and removing the new material from the semiconductor wafer through abrasive contact with a slurry and/or other abrasive surface or polishing pad (e.g., oxide removal). In CMP, the abrasive elements in the slurry typically remove the product of the chemical process and do not remove the bulk material of the semiconductor wafer, often leaving low subsurface damage.

Grinding may include coarse grinding operations and fine grinding operations. Coarse grinding operations may be used to reduce a thickness of a silicon carbide semiconductor wafer by about 20 microns to about 5 millimeters, such as about 20 microns to about 1 millimeter, such as about 20 microns to about 500 microns, such by about 25 microns to about 100 microns, such as by about 25 microns to about 80 microns, such as by about 40 microns to about 60 microns, or the like. Fine grinding operations may be used to reduce a thickness of a silicon carbide semiconductor wafer by about 1 micron to about 20 microns, such as by about 3 microns to about 15 microns, such as by about 5 microns to about 10 microns, or the like. After grinding, the silicon carbide semiconductor wafer may be subject to other surface processing operations, such as lapping operations and/or polishing operations, such as chemical mechanical polishing (CMP) operations.

Grinding silicon carbide semiconductor wafers may pose several challenges due to the inherent properties of the material. Silicon carbide is an extremely hard and brittle compound with a high level of abrasiveness, making the grinding process more demanding. One challenge is the potential for excessive tool wear and heat generation during grinding, which can affect the quality of the finished product. The hardness of silicon carbide may also lead to the formation of cracks or fractures if not properly managed, impacting the structural integrity of the material. Additionally, achieving precise dimensions and surface finishes can be challenging due to the resistance of silicon carbide to abrasion. Controlling parameters such as grind wheel selection, speed, feed rates, and cooling mechanisms is important to overcome these challenges and to provide the successful fabrication of silicon carbide components with the desired properties and performance.

Some grinding systems (e.g., Blanchard grinders) may include a rotary table and a vertical spindle that holds a grind wheel with a plurality of abrasive grinding teeth. The grinding teeth may include an abrasive containing material having abrasive elements. In some embodiments, the abrasive elements may include one or more of: (i) diamond; (ii) ceramic; (iii) metal nitride; (iv) metal oxide, (v) metal carbide; (vi) metalloid nitride; (vii) metalloid oxide; (viii) metalloid carbide; (ix) carbon group nitride; (x) carbon group oxide; or (xi) carbon group carbide. The semiconductor wafer may be mounted on the rotary table, for instance, using a chuck (e.g., vacuum chuck). In some examples, the axis of rotation of the semiconductor wafer is not aligned with the axis of rotation of the grind wheel. During the grinding process, the grinding teeth on the grind wheel traverse across a portion of the surface of the workpiece, removing material from the semiconductor wafer.

Blanchard grinders may only work on a small area of a semiconductor wafer surface at a time. As a result, Blanchard grinding often presents challenges with uniform material removal from a semiconductor wafer surface. Semiconductor wafers that have been subjected to Blanchard grinding may include high edge roll or other non-uniformities in wafer shape. Edge roll refers to a reduced thickness at the periphery of a semiconductor wafer.

Edge roll may result from a Blanchard grinder by the repetition of grinding teeth contacting the peripheral edge of the semiconductor wafer during a grinding operation, resulting in the removal of more material at the semiconductor wafer edge relative to the remainder of the semiconductor wafer. In some instances, the design of grinding rings used in grinding processes may create edge roll within a semiconductor wafer. A grinding ring refers to the ring of grinding teeth on, for instance, a grind wheel.

For example, gaps between grinding teeth may increase edge roll due to vibrations and other factors associated with the semiconductor workpiece. In addition, if the grind tooth that already passed the semiconductor wafer edge is shorter (as it was broken down by passing the edge and by grinding the silicon carbide surface), the following grind tooth is taller and hits the edge. As another example, due to pressure applied between grind teeth and the semiconductor wafer, the wafer edge while not currently pushed down between grind teeth, can be lifted and swarf build up between wafer edge and chuck can lead to the wafer edge being lifted up and thus subjected to higher removal. Other factors from grinding processes may lead to edge roll on a semiconductor wafer.

Accordingly, aspects of the present disclosure are directed to a grind wheel that reduces edge roll in semiconductor wafers during grinding processes. By reducing edge roll, the grinding systems according to examples of the present disclosure may increase the usable portion of a semiconductor wafer surface area for semiconductor device fabrication.

In some examples, the grind wheel may include a grinding ring with a radius less than or equal to the radius of a semiconductor wafer. However, in some embodiments, the radius of the grind ring may be greater than a radius of the semiconductor wafer. In some embodiments, the ratio between the radius of a semiconductor workpiece and a grinding ring may be in a range of about 1.1 to about 2.0, such as about 1.5 to about 2.0. Additionally, or alternatively, in some embodiments, the radius of the grinding ring may be such that an effective gap ratio between the plurality of grinding teeth at an edge of the grinding ring is about 0.8 or less, such as 0.5 or less or 0.1 or less. In some examples, the radius of the grinding ring is a non-zero radius, such as a radius of at least about 10 mm, such as at least about 20 mm. In some examples, the grind ring has an elliptical or non-concentric shape.

The effective gap ratio is indicative of the space between a last point of a first grinding tooth on a grind wheel contacting the edge of the semiconductor wafer and a first point of a second grinding tooth contacting the edge of the semiconductor wafer. The effective gap ratio provides a measure of the period during which no grinding tooth contacts an edge or periphery of the semiconductor wafer. The effective gap ratio is indicative of the percentage or ratio relative to the actual gap between grind teeth where no grind tooth is in contact with the edge or periphery of the semiconductor wafer. An effective gap ratio of zero indicates that at least one grinding tooth is always in contact with an edge or periphery of the semiconductor wafer. An effective gap ratio of 0.8 indicates that for 80% of the actual gap between grind teeth, there is no grind tooth in contact with a periphery or an edge of the semiconductor wafer.

In some examples, the grind wheel may include a grinding ring with a plurality of grinding teeth. In some instances, the grind wheel may include a second grinding ring that is arranged concentrically with the first grinding ring and includes a second plurality of grinding teeth. The second plurality of grinding teeth may be arranged in a variety of patterns to complement the first grinding ring. For instance, the grinding teeth of the second grinding ring may be staggered relative to the grinding teeth of the first grinding ring.

The grinding teeth on the grind wheels may each include a grind surface that contacts the semiconductor workpiece. The grind surface(s) may be a variety of shapes, such as a parallelogram, trapezoid, rectangle, or square shape. In some examples, the grind surface may include a first edge and a second edge that form an acute angle in a range of about 1° to about 60°, such as about 30° to about 45°. The grinding teeth of the grinding rings may be uniform to each other with each grinding tooth exhibiting the same shape or angle between edges. However, in some embodiments, the grinding teeth may have varying shapes with respect to each other. That is, each grinding tooth may take its own shape and angle between edges. In some embodiments, the edges and/or corners between edges of the grinding teeth may be rounded.

In some examples, the grind wheel may include a continuous grinding ring. More specifically, the grind wheel may include a grinding ring of abrasive-containing material that forms a ring with no breaks. The continuous grinding ring may include one or more holes with each hole having a diameter less than the width of the continuous grinding ring. The continuous grinding ring may additionally include a radius that may, in some examples, be less than or equal to a radius of a semiconductor workpiece. However, in some embodiments, the radius of the continuous grinding ring may be greater than a radius of the semiconductor workpiece. The continuous grinding ring may also have a variety of shapes. For instance, the continuous grinding ring may be a uniform circle, or the continuous grinding ring may also be a meandering ring with one or more undulations.

Aspects of the present disclosure are additionally directed to various systems using the example grind wheels discussed herein. For instance, example systems may be grinding systems, such as Blanchard grinding systems. Example grinding systems may include a workpiece support that is operable to support a semiconductor workpiece, such as a silicon carbide workpiece, and rotate the semiconductor workpiece about a first axis. Example grinding systems may additionally include a grind wheel that is operable to rotate about a second axis.

The grind wheel may include the variety of grinding ring designs discussed herein such as, for example, a grinding ring with a plurality of teeth arranged in a ring, a continuous grinding ring with no breaks, or other grind wheel in accordance with aspects of the present disclosure. The grind wheel may be positioned such that the grinding ring of the grind wheel at least partially overlaps a center of the workpiece support. In some embodiments, example grinding systems may additionally include a translation system that may be configured to move the grinding disc relative to the workpiece support.

Aspects of the present disclosure provide a number of technical effects and benefits. For instance, as previously mentioned, reducing edge roll of semiconductor workpieces increases the surface area of the semiconductor workpiece that has a constant thickness, increasing the amount of usable surface area of the semiconductor workpiece for semiconductor manufacturing. Additionally, maintaining thickness of the semiconductor workpiece, and reducing workpiece movement during grinding processes, reduces the wear and consumption rate of tools within grinding systems, such as the consumption rate of grinding teeth. Grinding teeth are commonly made of expensive materials, such as diamond, therefore reducing the consumption rate of grinding teeth significantly reduces the cost of manufacturing semiconductor workpieces.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, structure, region, or substrate is referred to as being "on" or extending "onto" another element, it may be directly on or extend directly onto the other element or intervening elements may also be present and may be only partially on the other element. In contrast, when an element is referred to as being "directly on" or extending "directly onto" another element, there are no intervening elements present, and may be partially directly on the other element. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

As used herein, a first structure "at least partially overlaps" or is "overlapping" a second structure if an axis that is perpendicular to a major surface of the first structure passes through both the first structure and the second structure. A "peripheral portion" of a structure includes regions of a structure that are closer to a perimeter of a surface of the structure relative to a geometric center of the surface of the structure. A "center portion" of the structure includes regions of the structure that are closer to a geometric center of the surface of the structure relative to a perimeter of the surface. "Generally perpendicular" means within 15 degrees of perpendicular. "Generally parallel" means within 15 degrees of parallel.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the disclosure are described herein with reference to cross-section illustrations that are schematic illustrations of idealized embodiments (and intermediate structures) of the disclosure. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Similarly, it will be understood that variations in the dimensions are to be expected based on standard deviations in manufacturing procedures. As used herein, "approximately" or "about" includes values within 10% of the nominal value.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

Some embodiments of the invention are described with reference to semiconductor layers and/or regions which are characterized as having a conductivity type such as n type or p type, which refers to the majority carrier concentration in the layer and/or region. Thus, n type material has a majority equilibrium concentration of negatively charged electrons, while p type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

In the drawings and specification, there have been disclosed typical embodiments and, although specific terms are employed, they are used in a generic and descriptive sense only and not for purposes of limitation of the scope set forth in the following claims.

FIG. 1 depicts an example grinding system 100 for grinding a silicon carbide semiconductor wafer 105 according to example embodiments of the present disclosure. The silicon carbide semiconductor wafer 105 may include 4H silicon carbide, 6H silicon carbide or other crystal structure. The silicon carbide semiconductor wafer 105 may be doped or undoped. The grinding system 100 includes a workpiece support 110, a grind apparatus such as a grind wheel 120, a delivery system 130 (e.g., coolant delivery system), and a controller 160. In some examples, the grinding system 100 may include an actuator 140 as will be described in more detail below. Additionally, in some examples, the grinding system 100 may include a translation stage 170 that may be configured to move the grind wheel 120 relative to the workpiece support 110. Further, the grinding system 100 may, in some instances, be a Blanchard grinding system.

More specifically, the grinding system 100 includes the workpiece support 110. The workpiece support 110 may be operable to support or carry the semiconductor wafer 105. The workpiece support 110 may include a chuck operable to hold the semiconductor wafer 105. The chuck may be a vacuum chuck, electrostatic chuck, or other suitable support operable to hold the semiconductor wafer 105 in place during a grinding operation. The workpiece support 110 may be operable to rotate about an axis 104. The workpiece support 110 may be operable to rotate about the axis 104 in either a clockwise or counterclockwise direction. In some examples, the workpiece support 110 may rotate, for instance, at a rotational speed in a range of about 40 rpm to about 10000 rpm, such as about 40 rpm to about 7500 rpm, such as about 40 rpm to about 2000 rpm, such as about 40 rpm to about 1000 rpm, such as about 40 rpm to about 500 rpm, such as about 40 rpm to about 120 rpm.

The grinding system 100 includes a grind wheel 120. The grind wheel 120 includes a plurality of grinding teeth 122 arranged in an annular configuration about the grind wheel 120 to form a grinding ring. A grinding ring is any annular or partially annular structure of grinding teeth or other abrasive-containing surface on a grind wheel. A grinding ring may have any suitable shape and does not necessarily have to be circular in shape. The grinding teeth 122 provide an abrasive surface for the grind wheel 120. One or more of the grinding teeth 122 may include an abrasive containing material. The abrasive containing material of the grinding teeth 122 may be sufficient to perform a grinding operation on silicon carbide. In some examples, each of the plurality of grinding teeth 122 have an abrasive containing material. In some examples, only a subset of the plurality of grinding teeth 122 have an abrasive containing material. For instance, as one example, every other grind tooth in the plurality of grinding teeth 122 may have an abrasive containing material. The other grinding teeth in the plurality of grinding teeth may not include an abrasive containing material.

The abrasive containing material may include a plurality of abrasive elements (e.g., abrasive particles) in a host material or matrix. In some examples, the host material may include one or more of vitreous material, metal, resin, and/or other sintered material and/or organic material. The vitreous material may be a glass matrix material to hold the abrasive elements inside a matrix. Metals and/or organic materials may be used as a host matrix or as part of a host matrix for the abrasive elements. The abrasive elements in some embodiments, may be diamond (e.g., diamond abrasive particles) or a diamond coated material. In some embodiments, the abrasive elements may be, for instance, a ceramic material (e.g., ceramic abrasive particles). The ceramic material may be, for instance, boron carbide ($B_4C$) and cubic boron nitride (BN). In some examples, the abrasive elements may include one or more metal oxides (sintered and/or unsintered). In some embodiments, the abrasive elements may include silica, ceria, zirconia, alumina, silicon carbide, metal nitrides, and/or other carbides. In some examples, the abrasive elements of the grinding teeth 122 may have a hardness in a range of about 7 Mohs to about 10 Mohs, such as about 10 Mohs.

Figure 2:
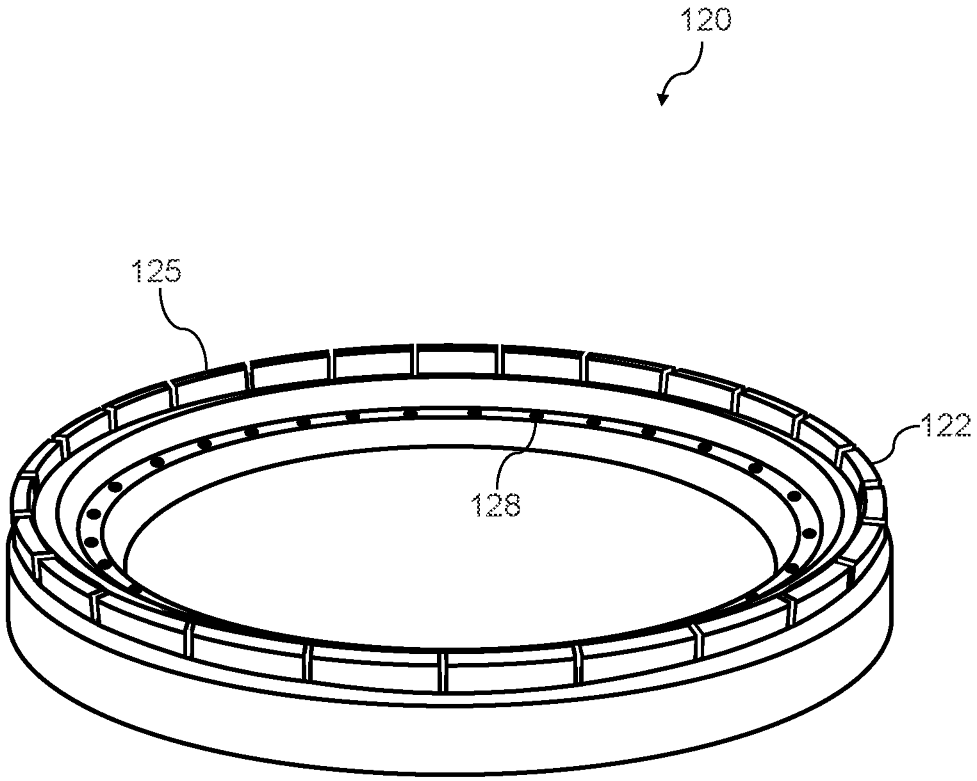
FIG. 2 depicts a perspective view of an example grind wheel according to example embodiments of the present disclosure.

FIG. 2 depicts a perspective view of an example grind wheel 120 according to example embodiments of the present disclosure. As illustrated, the grind wheel 120 includes the plurality of grinding teeth 122 arranged in a grinding ring 125 on the grind wheel 120. For instance, the grinding teeth 122 are arranged in a concentric ring about the center of the grind wheel 120. However, the grinding teeth 122 may include other suitable shapes and configurations without deviating from the scope of the present disclosure. There may be a space between each of the grinding teeth 122. Each of the grinding teeth 122 may have a generally rectangular shape. However, the grinding teeth 122 may include other suitable shapes and configurations without deviating from the scope of the present disclosure. The grind wheel 120 may include one or more apertures 128 for delivery and/or transport of a coolant, additive, or other fluid.

Referring back to FIG. 1, the grind wheel 120 may be operable to rotate about an axis 124. The axis 124 is not aligned with the axis 104 associated with the workpiece support 110. The grind wheel 120 may be operable to rotate in either a clockwise or counterclockwise direction. In some examples, the grind wheel 120 may rotate, for instance, at a rotational speed in a range of about 40 rpm to about 10000 rpm, such as about 40 rpm to about 7500 rpm, such as about 40 rpm to about 2000 rpm, such as about 40 rpm to about 1000 rpm, such as about 40 rpm to about 500 rpm, such as about 40 rpm to about 120 rpm. The grind wheel 120 may rotate in the same direction as the workpiece support 110 or in a different direction relative to the workpiece support 110.

The grind wheel 120 may be controlled to provide a downforce 126 on the silicon carbide semiconductor wafer 105. The downforce 126 may be controlled to adjust the grinding rate of the grinding operation of the silicon carbide semiconductor wafer 105. A higher downforce 126 may result in a faster grinding rate. The grind wheel 120 may be controlled to be in contact with the semiconductor wafer 105 such that plurality of grinding teeth 122 (e.g., the grinding ring 125) at least partially overlaps the center of the workpiece support 110 and passes over a center of the semiconductor wafer 105 during a grinding operation.

In some examples, the workpiece support 110 and/or the grind wheel 120 may be controlled to adjust a "head angle" 127 between the workpiece support 110 and the grind wheel 120 as indicated by arrows 129. The head angle refers to the angle between the workpiece support 110 and the grind wheel 120. In some examples, the head angle 127 is about 0° indicating that the workpiece support 110 and the grind wheel 120 are generally parallel. However, the head angle 127 may be adjusted in the positive or negative direction as indicated by arrows 129 (e.g., by some angle in a range of +/−) 20°. The head angle may be adjusted by adjusting an angle of the workpiece support 110 and/or the grind wheel 120. For instance, the head angle 127 may be adjusted to compensate, for instance, for semiconductor wafer non-uniformities resulting from grind wheel 120 deflections resulting from application of the downforce 126 during a grinding operation.

As shown in FIG. 1, the grinding system 100 may include a delivery system 130 (e.g., coolant delivery system). The delivery system 130 may be used to deliver a fluid 133, such a coolant (e.g., deionized water) or other fluid, to a surface of the semiconductor wafer 105 and/or the grind wheel 120 (e.g., the grinding teeth 122) during a grinding process, such as a coarse grinding process or a fine grinding process. The delivery system 130 is depicted as having two fluid delivery outlets 132 for purposes of illustration and discussion. Those of ordinary skill in the art, using the disclosures provided herein, will understand that the grinding system 100 may include more or fewer fluid delivery outlets 132 arranged to deliver a coolant or other fluid 133 to the grind wheel 120 and/or to the semiconductor wafer 105 without deviating from the scope of the present disclosure.

In some examples, the delivery system 130 may include or be coupled to an additive delivery system 135. The additive delivery system 135 may be configured to provide one or more additives to the fluid 133 (e.g., coolant) through the delivery system 130. In some examples, the additive may include one or more of an oxidizing agent, an etchant, or an abrasive containing additive. In some examples, the additive may include an actuatable additive. In some examples, the additive may be a surfactant and/or a lubricant that affect the transport of grind products. In some examples, the additive may be an actuatable additive. In some examples, the additive may be a photochemical.

In some examples, as described above, the grinding system 100 may include an actuator 140. The actuator 140 may be configured to provide a stimulus to an actuatable additive to activate properties (e.g., reactive properties) of the additive. The actuator 140 may be any suitable device operable to provide a stimulus to the additive. In some examples, the actuator 140 is separate from the grind wheel 120 as indicated in FIG. 1. In some examples, the actuator 140 may be a part of the grind wheel 120.

In some examples, the actuator 140 includes one or more of an electrostatic actuator, electrochemical actuator, acoustic actuator, ultrasonic actuator, optical actuator, ultraviolet actuator, thermal actuator, or plasma-based actuator. An electrochemical actuator may be operable to provide an electrochemical stimulus to the additive. An acoustic actuator may be operable to provide an acoustic stimulus to the additive. An ultrasonic actuator may be configured to provide an ultrasonic stimulus to the additive. An optical actuator may be configured to provide an optical stimulus to the additive. A thermal actuator may expose an additive to a thermal stimulus (e.g., heat source, laser, lamp, etc.). An ultraviolet actuator (e.g., ultraviolet light source) may be operable to provide UV light stimulus to the additive. A plasma-based actuator may be operable to generate a plasma to act as a stimulus to the additive.

In some examples, for instance, an ultraviolet actuator may provide UV light stimulus to provide photochemical activation and/or photocatalytic effects in an actuatable additive, such as hydrogen peroxide and/or organic peroxide to generate, for instance, hydroxyl radicals. In some examples, activation of additives (e.g., photo activation of additives) may include using catalytic effects by providing elements or components in contact with the additive, such as $CeO_2$ elements, $TiO_2$ elements, or other metals and metal oxides.

In some embodiments, the additive may be inert and not react with the grinding teeth 122 or the silicon carbide semiconductor wafer 105 until the material is actuated by stimulus from the actuator 140. In some embodiments, the additive may be activated to react with the grinding teeth 122 and/or the silicon carbide semiconductor wafer 105 only when exposed (or not exposed) to the external stimulus from the actuator 140. In this way, the active properties of the additive may be controlled (e.g., pulsed) by controlling the actuator 140. For instance, by pulsing the actuator 140, the active properties of the additive may also be pulsed.

In some examples, the additive may be activated when it interacts (e.g., mixes, contacts, etc.) other additives or components in the grind system 100. For instance, the additive may interact with other additives already present on the semiconductor wafer 105 and/or the grinding teeth 122 to activate properties of the additive.

The translation stage 170 may be operable to move the grind wheel 120 relative to the workpiece support 110. For instance, the translation stage 170 may be operable to move the grind wheel 120 such that grinding teeth 122 on the grind wheel 120 pass over a center of the semiconductor wafer 105 during a grinding operation.

The system 100 includes one or more control devices, such as a controller 160. The controller 160 may include one or more processors 162 and one or more memory devices 164. The one or more memory devices 164 may store computer-readable instructions that when executed by the one or more processors 162 cause the one or more processors 162 to perform one or more control functions, such as any of the functions described herein. The controller 160 may be in communication with various other aspects of the system 100 through one or more wired and/or wireless control links. The controller 160 may send control signals to the various components of the system 100 (e.g., the workpiece support 110, the grind wheel 120, the coolant delivery system 130, the actuator 140, the translation stage 170) to implement a grinding operation on the silicon carbide semiconductor wafer 105.

Figure 3A:
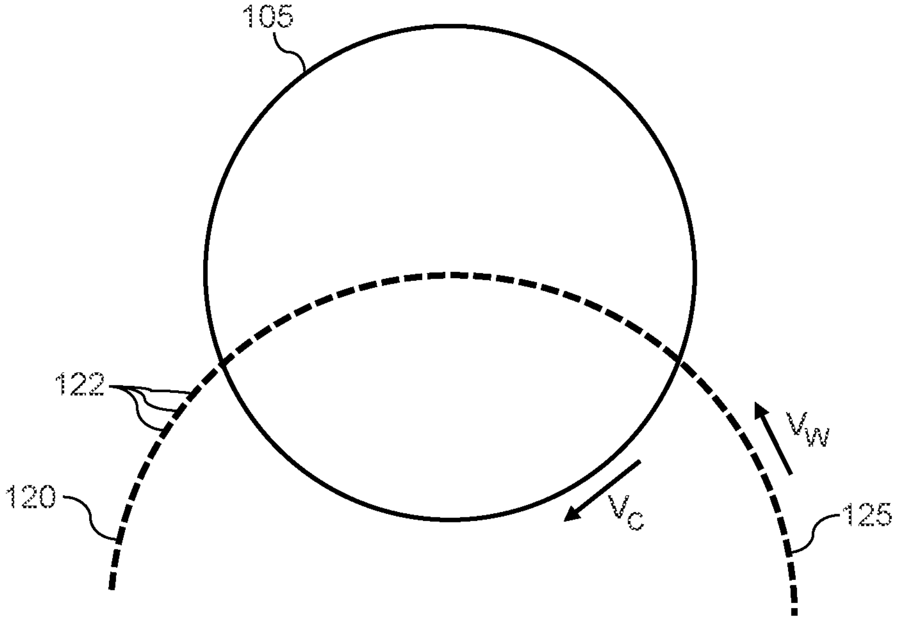
FIGS. 3A and 3B depict the generation of edge roll in semiconductor wafers during a grinding process.
Figure 3B:
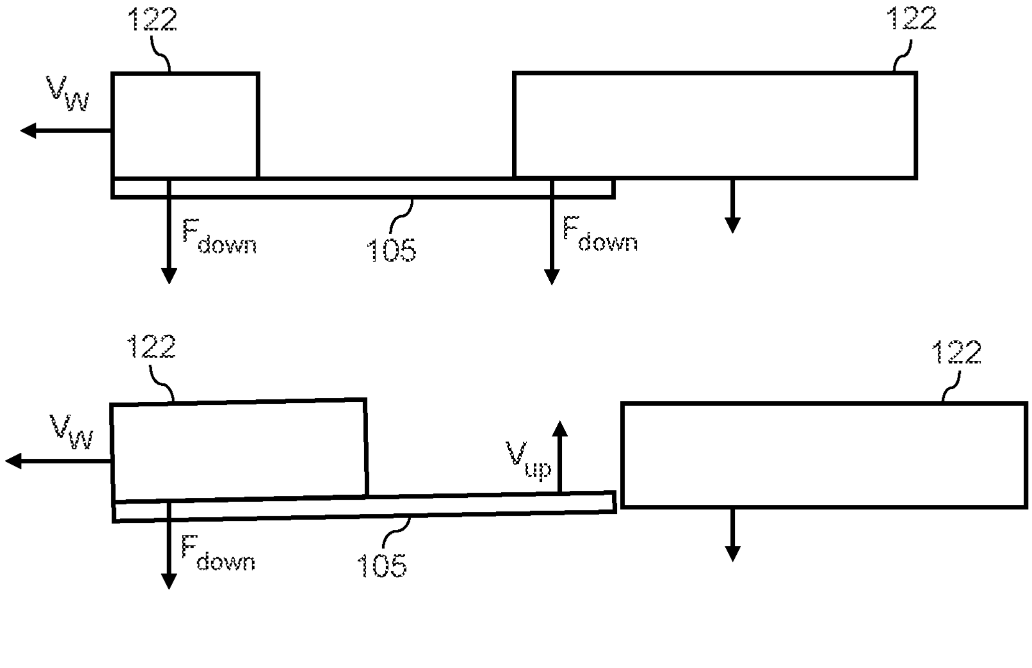

FIGS. 3A and 3B depict the generation of edge roll in semiconductor wafers in a grinding system. More specifically, FIG. 3A depicts the semiconductor wafer 105 with a rotational force $V_c$ in a clockwise direction and a grind wheel 120 including a plurality of grinding teeth 122 arranged in a grinding ring 125 with a rotational force $V_w$ in a counterclockwise direction. In some examples, the semiconductor wafer 105 and the grind wheel 120 may be rotated in opposing directions to efficiently grind the surface of the semiconductor wafer 105.

The rotational directions provided in FIGS. 3A and 3B are provided for example purposes. Those of ordinary skill in the art, using the disclosures provided herein, will understand that the semiconductor wafer 105 may be rotated in a counterclockwise direction and the grind wheel 120 may be rotated in a clockwise direction. In some examples, the semiconductor wafer 105 and the grind wheel 120 may be rotated in the same direction (e.g., either clockwise or counterclockwise direction).

FIG. 3B depicts a cross sectional view of the grind wheel 120 and plurality of grinding teeth 122 contacting the semiconductor wafer 105 during a grinding operation. To effectively grind the semiconductor wafer 105, the down force $F_{down}$ must be applied to the grind wheel 120 and therefore to the semiconductor wafer 105. However, as the plurality of grinding teeth 122 pass over the edge of the semiconductor wafer 105, the gap(s) between the plurality of grinding teeth 122 reduce the down force $F_{down}$ from the edge of the semiconductor wafer 105 causing it to vibrate upward with the force $V_{up}$. While subtle, the vibrating force $V_{up}$ causes the edge of the semiconductor wafer 105 to rise above the flat plane of the semiconductor wafer 105 and contact the grinding tooth 122 after the gap at a different height than the rest of the semiconductor wafer 105. As a result, more material may be removed from the semiconductor wafer 105 at the edge of the semiconductor wafer 105 compared to the rest of the surface. In some instances, this phenomenon can be amplified by insufficient vacuum attachment of the semiconductor wafer 105 to the workpiece support 110 (e.g., chuck), swarf pushed between wafer 105 and workpiece support 110 (e.g., chuck) during vibration, or elasticity of the workpiece support 110.

Figure 4:
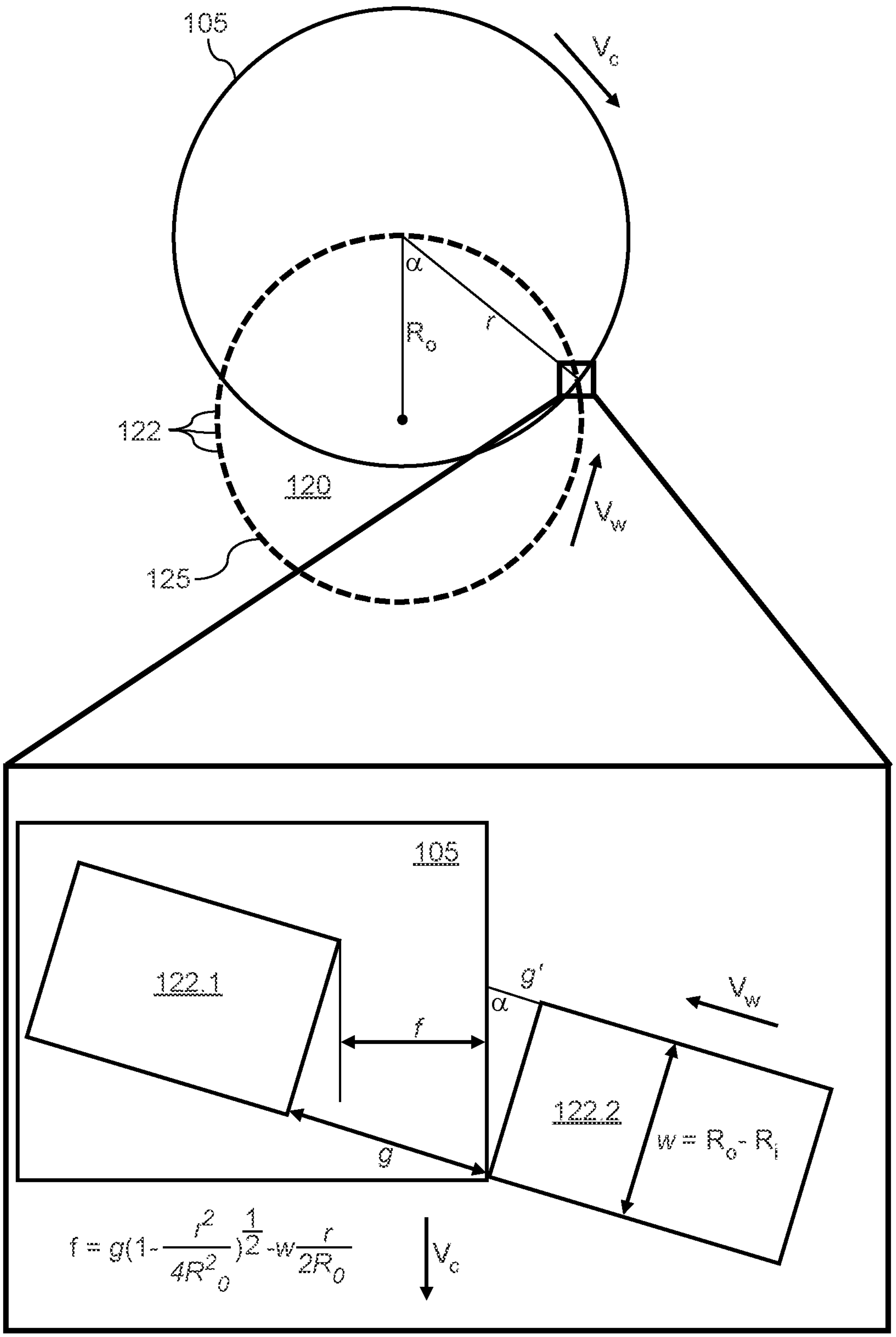
FIG. 4 depicts an example grind wheel for a grinding system according to example aspects of the present disclosure.

FIG. 4 depicts an example grind wheel 120 for grinding systems according to example aspects of the present disclosure. The grind wheel 120 may be implemented in example systems of the present disclosure such as the grinding system 100 depicted in FIG. 1. The grind wheel 120 may include a plurality of grinding teeth 122 and may be used to grind the surface of the semiconductor wafer 105. In some examples, edge roll may be reduced by reducing or eliminating the effective gap f between a last point of a first grinding tooth 122.1 contacting the edge or periphery of the semiconductor wafer 105 and a first point of a next grinding tooth 122.2 contacting the edge or periphery of the semiconductor wafer 105. One example aspect of the present disclosure is directed to reducing or eliminating the effective gap ratio by the radius $R_0$ of the grind ring having the plurality of grinding teeth 122 as described below with reference to FIG. 5B.

In some examples, the equation, $$f = g\left(1 - \frac{r^2}{4R_O^2}\right)^{\frac{1}{2}} - w\frac{r}{2R_O}$$

provides the effective gap f between grinding teeth contacting the edge of the semiconductor wafer 105 as a function of the radius r of the semiconductor wafer 105, the radius $R_0$ of the grinding ring 125 (the outer radius of the grinding ring 125), the width w of the grinding teeth 122 (e.g., difference between outer radius Ro and inner radius Ri of the grind ring), and the gap g between the grinding teeth 122. An effective gap ratio is the ratio of f/g. The effective gap ratio f/g may be reduced as the ratio $r/R_o$ increases. In some examples, when $R_o$ is ½ the radius r of the semiconductor wafer 105, the effective gap ratio f/g is approximately 0. Accordingly, some aspects of the present disclosure are directed to a grind ring with a reduced radius, such as a grind wheel with a plurality of grinding teeth that makes up a grinding ring with a radius that is less than a radius of a semiconductor wafer workpiece.

Figure 5A:
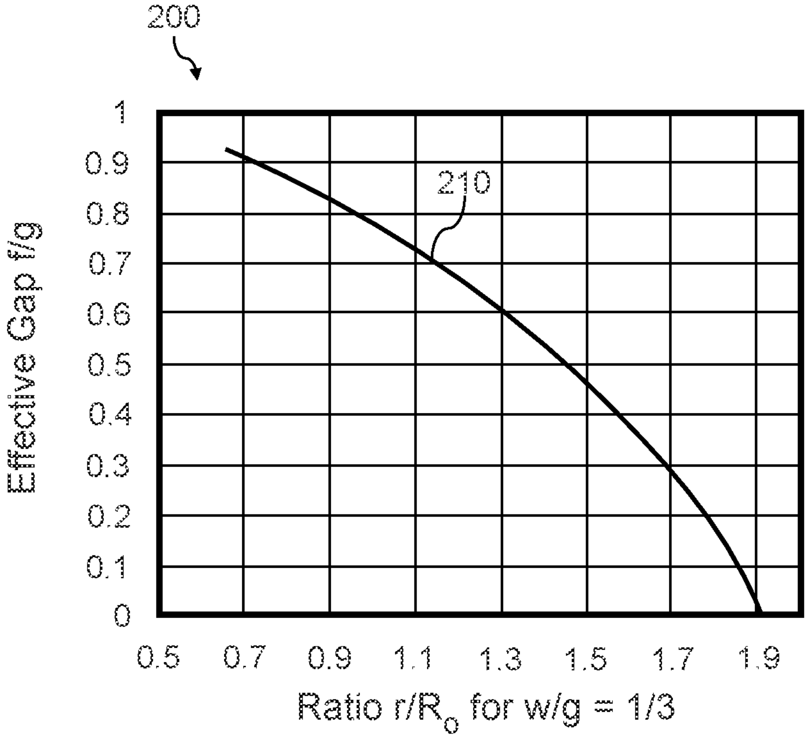
FIGS. 5A and 5B depict effective gap ratio as a function of a ratio of a radius of a grinding ring to a radius of a semiconductor workpiece.
Figure 5B:
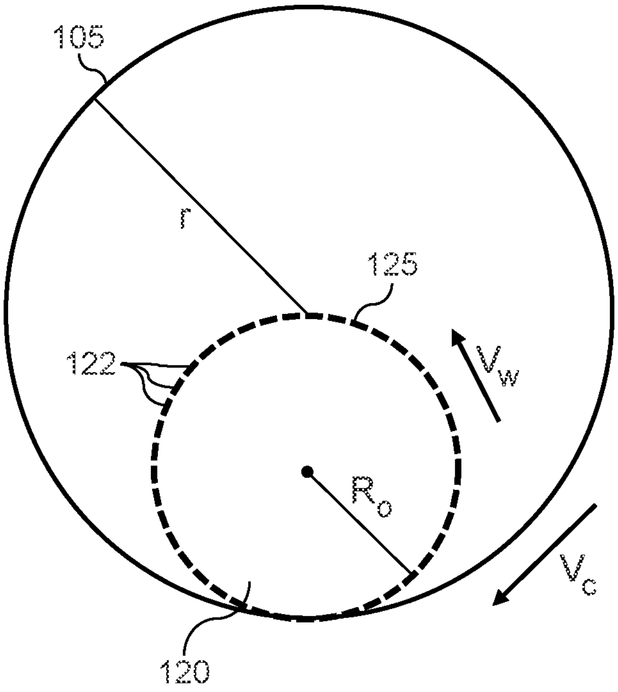

FIGS. 5A and 5B depict an example graph 200 showing effective gap ratio f/g of an example grind wheel 120 as a function of the ratio $r/R_0$ of the radius of the semiconductor wafer 105 to the radius of the grinding ring 125 including the plurality of grinding teeth 122 with a constant tooth width w to tooth base gap g ratio w/g of ⅓. The example graph 200 further depicts a downward trend to an effective gap ratio f/g as the ratio $r/R_0$ increases.

In some examples, the ratio between the radius of the semiconductor wafer 105 and the radius of the grind wheel 120 may be in a range of about 1.1 to about 2.0, such as about 1.5 to about 2.0. Additionally, or alternatively, in some examples, the radius of the grinding ring 125 may be such that the effective gap ratio f/g between the plurality of grinding teeth 122 is about 0.8 or less, such as 0.5 or less, such as about 0.1 or less.

In some examples, the effective gap ratio may be adjusted by adjusting the ratio between the actual gap g and the width w. For instance, as g/w approaches zero, the effective gap ratio f/g will also approach zero or become negative (e.g., no effective gap).

Figure 6:
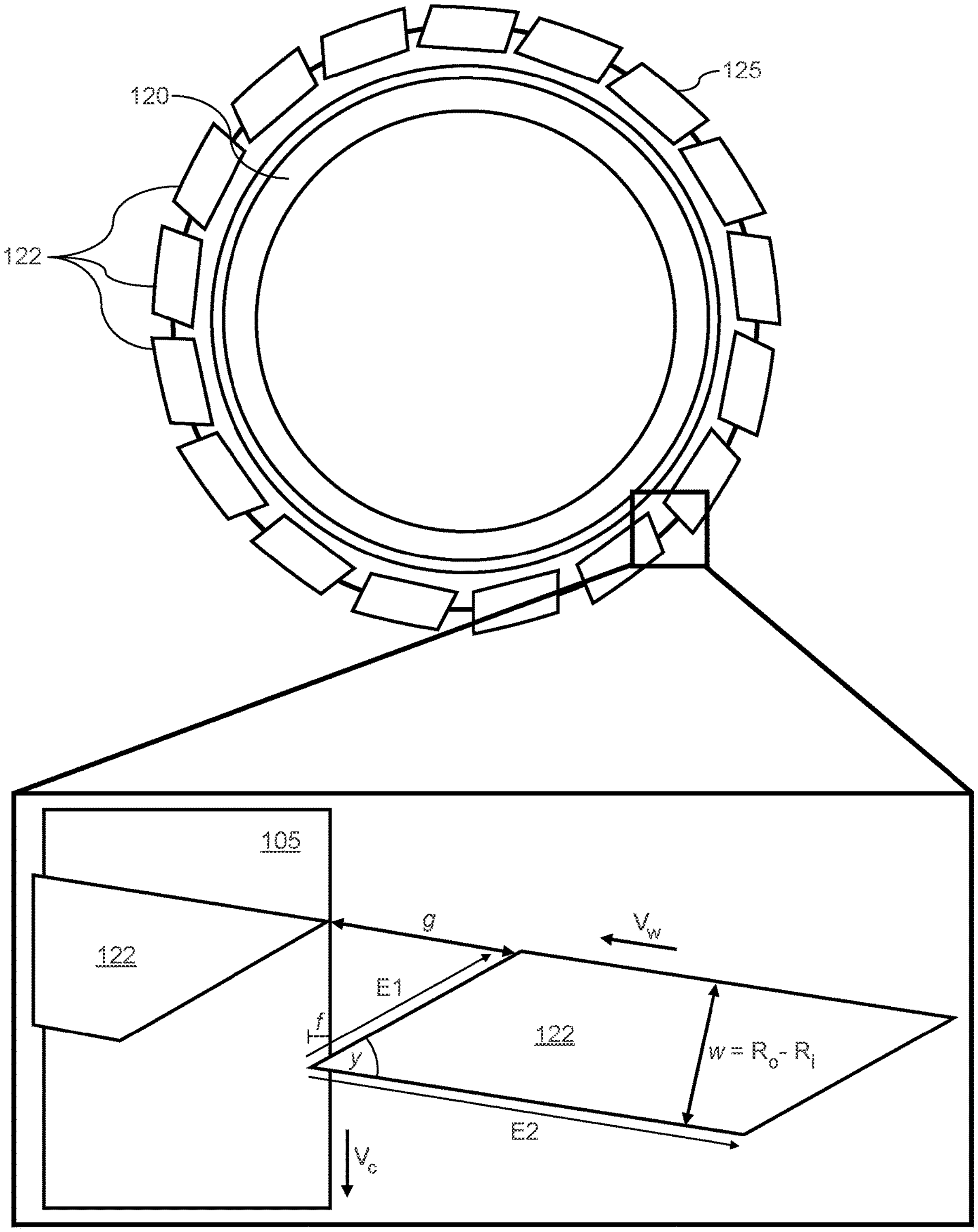
FIG. 6 depicts an example grind wheel for grinding systems according to example aspects of the present disclosure.

FIG. 6 depicts an example grind wheel 120 for a grinding system according to example aspects of the present disclosure. The grind wheel 120 may be implemented, for instance, in the example grinding system 100 depicted in FIG. 1. The grind wheel 120 may include a plurality of grinding teeth 122 in a grinding ring 125, with each grinding tooth 122 including a first edge E1, a second edge E2, and an angle y between the two edges. Similar to the grind wheel(s) depicted in FIG. 4, the grind wheel 120 may reduce the effective gap ratio f/g between each grinding tooth 122 when applied to the surface of a semiconductor wafer 105.

The grinding ring 125 may have a space g between each grinding tooth 122 and a width w that is equal to the difference between Ro (outer radius of the grinding ring 125)−Ri (inner radius of the grinding ring 125). In some examples, the grind wheel 120 may reduce the effective gap ratio f/g by changing the shape of the grind surface of the plurality of grinding teeth 122. For instance, the grind surface of the plurality of grinding teeth 122 may be a parallelogram shape and may include an acute angle y between the first edge E1 and the second edge E2. In some examples, the angle y may be an acute angle in a range of about 1° to about 60°, such as about 30° to about 45°. In some embodiments, the edges and/or corners between edges of the grinding teeth 122 may be rounded. In some examples, the grind surface may have other suitable shapes without deviating from the scope of the present disclosure.

Figure 7:
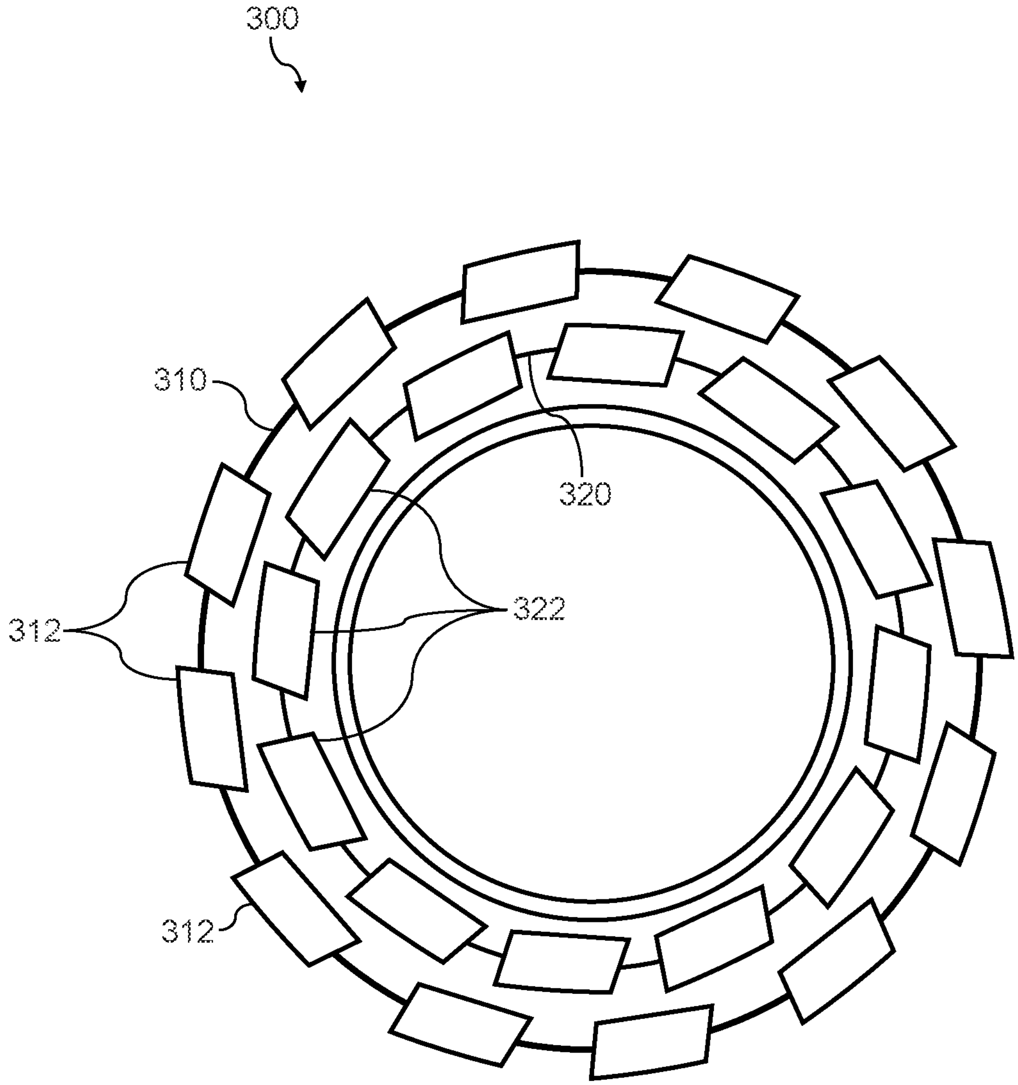
FIG. 7 depicts an example grind wheel for grinding systems according to example aspects of the present disclosure.

FIG. 7 depicts an example grind wheel 300 for a grinding system according to example aspects of the present disclosure. The grind wheel 300 may be implemented, for instance, in the example grinding system 100 depicted in FIG. 1. The grind wheel 300 may include a first grinding ring 310 including a first plurality of grinding teeth 312 around the periphery of the grind wheel 300. Additionally, the grind wheel 300 may include a second grinding ring 320 with a second plurality of grinding teeth 322 arranged concentrically or otherwise within the first grinding ring 310. Additional grinding rings may be included and arranged concentrically or otherwise within the first grinding ring 310 without deviating from the scope of the present disclosure. Other suitable grinding ring shapes may be used without deviating from the scope of the present disclosure. For instance, in some examples, the grinding rings may be helical or spiral shapes. Other example grinding ring shapes are illustrated in FIGS. 13-22.

In some examples, the second plurality of grinding teeth 322 may be staggered relative the first plurality of grinding teeth 312. The two pluralities of grinding teeth 312, 322 may be staggered so that the grinding teeth 312, 322 overlap the edges of one another and reduce any gaps in the grinding teeth 312, 322 of the grind wheel 300 contacting an edge of a semiconductor workpiece, such as a semiconductor wafer. For instance, in some examples, at least about 5% of a grinding tooth 322 may overlap with a grinding tooth 312, such as at least about 10%, such as at least about 20%, such as in a range of about 5% to about 20%. As used herein, a portion of a first grinding tooth is considered to overlap with another portion of a second grinding tooth when a radial line toward a center of the grind wheel intersects both the portion of the first grinding tooth and the portion of the second grinding tooth.

Figure 8:
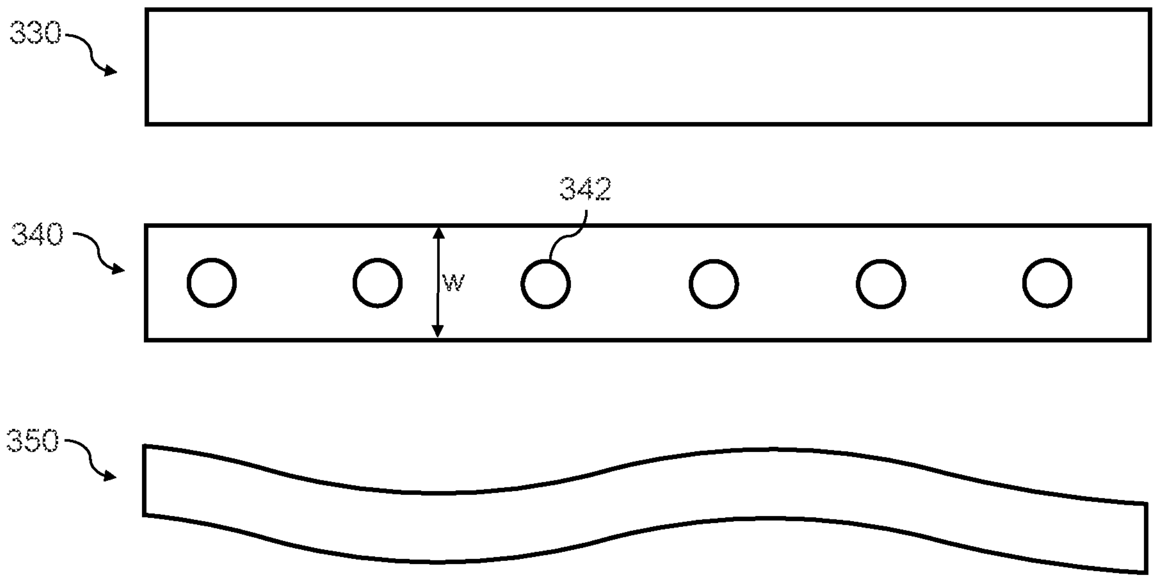
FIG. 8 depicts example grinding surfaces according to example aspects of the present disclosure.

The grind wheel may include other types of abrasive surfaces to reduce edge roll without deviating from the scope of the present disclosure. For instance, FIG. 8 depicts various configurations of a grinding surface for a grind wheel that may be used in accordance with aspects of the present disclosure. For instance, in some examples, the grind wheel 300 may include a continuous grinding ring 330 around the periphery of the grind wheel that includes an abrasive-containing material with one or more abrasive elements. In some embodiments, the abrasive elements may include one or more of: (i) diamond; (ii) ceramic; (iii) metal nitride; (iv) metal oxide, (v) metal carbide; (vi) metalloid nitride; (vii) metalloid oxide; (viii) metalloid carbide; (ix) carbon group nitride; (x) carbon group oxide; or (xi) carbon group carbide. In some embodiments, the continuous grinding ring 330 may have a radius less than or equal to a radius of a semiconductor workpiece. However, in some embodiments, the continuous grinding ring 330 may have a radius of greater than the semiconductor workpiece. The continuous grinding ring 330 may include no gaps or breaks.

In some examples, the grind wheel 300 may include a continuous grinding ring 340 around the periphery of the grind wheel that includes an abrasive-containing material with one or more abrasive elements. In some embodiments, the abrasive elements may include one or more of: (i) diamond; (ii) ceramic; (iii) metal nitride; (iv) metal oxide, (v) metal carbide; (vi) metalloid nitride; (vii) metalloid oxide; (viii) metalloid carbide; (ix) carbon group nitride; (x) carbon group oxide; or (xi) carbon group carbide. In some embodiments, the continuous grinding ring 340 may have a radius less than or equal to a radius of a semiconductor workpiece. However, in some embodiments, the continuous grinding ring 340 may have a radius of greater than the semiconductor workpiece. The continuous grinding ring 340 may include one or more holes 342 to facilitate cooling and transport of grind product during a grinding process. The holes 342 may have a diameter that is smaller than a width w of the continuous grinding ring 340.

In some examples, the grind wheel 300 may include a continuous grinding ring 350 around the periphery of the grind wheel that includes an abrasive-containing material with one or more abrasive elements. In some embodiments, the abrasive elements may include one or more of: (i) diamond; (ii) ceramic; (iii) metal nitride; (iv) metal oxide, (v) metal carbide; (vi) metalloid nitride; (vii) metalloid oxide; (viii) metalloid carbide; (ix) carbon group nitride; (x) carbon group oxide; or (xi) carbon group carbide. In some embodiments, the continuous grinding ring 350 may have a radius less than or equal to a radius of a semiconductor workpiece. However, in some embodiments, the continuous grinding ring 350 may have a radius of greater than the semiconductor workpiece. The continuous grinding ring 350 may be a meandering grind ring that includes one or more undulations.

Figure 9:
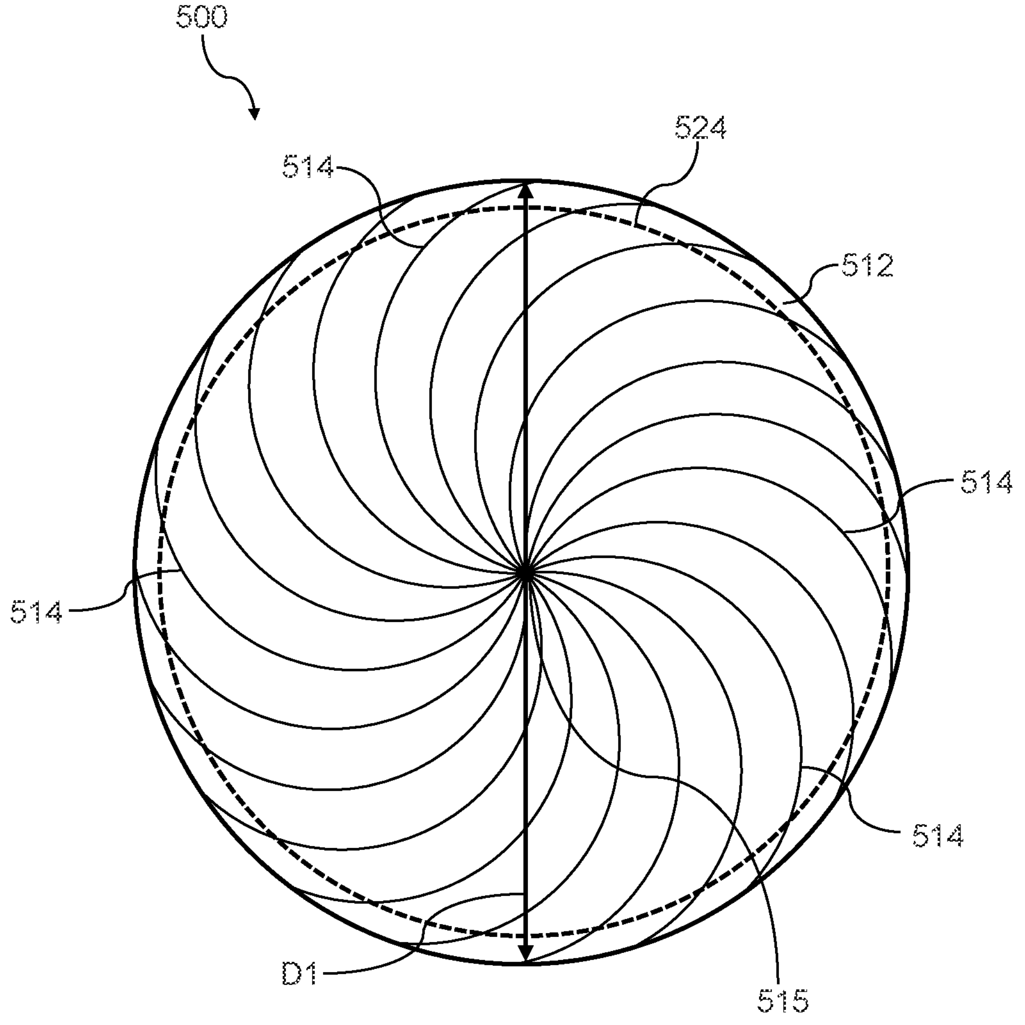
FIG. 9 depicts a plan view of an example silicon carbide semiconductor wafer having a silicon carbide surface according to example embodiments of the present disclosure.

FIG. 9 depicts a plan view of an example silicon carbide semiconductor wafer 500 having a silicon carbide surface 512 according to example embodiments of the present disclosure. In some examples, the silicon carbide semiconductor wafer 500 may be, for instance, 4H silicon carbide or 6H silicon carbide or other suitable silicon carbide structure.

In some examples, silicon carbide semiconductor wafer 500 has a diameter D1 in a range of about 100 millimeters to about 300 millimeters, such as in a range of about 150 millimeters to about 200 millimeters, such as about 100 millimeters, such as about 100 millimeters, such as about 150 millimeters, such as about 200 millimeters. The silicon carbide semiconductor wafer 500 may have thickness of less than about 500 microns, such as less than about 300 microns, such as less than about 200 microns, such as in a range of about 100 microns to about 200 microns, such as in a range of about 120 microns to 180 microns.

The semiconductor wafer 500 may include a grind wheel defined grind pattern 514 on the silicon carbide surface 512. The semiconductor wafer 500 has a center 515. The grind wheel defined grind pattern 514 is associated with a grinding operation performed by a grind wheel, such as by the grind wheels of FIGS. 1-8. As illustrated, the grind pattern 514 is a Blanchard grind pattern that has one or more repeating spiral structures as shown on the semiconductor wafer 500. In some examples, after polishing, the remnants of the Blanchard grind pattern may be apparent by the presence of latent grind grooves in a pattern (e.g., hub and spoke pattern) on the semiconductor wafer 500. FIG. 9 depicts a "perfect" Blanchard grind pattern 514 for purposes of illustration and discussion. Those of ordinary skill in the art, using the disclosures provided herein, will understand that a Blanchard pattern is characterized by one or more of the spiral structures shown in FIG. 9 in regular or at irregular intervals on different portions of the surface 512 of the semiconductor wafer 500.

In some examples, the semiconductor wafer 500 has an edge roll over 10 millimeters from a peripheral edge of the semiconductor wafer of less than about 0.7 microns, such as less than about 0.3 microns. In some embodiments, the grinding systems and methods according to example aspects of the present disclosure may produce a plurality of semiconductor wafers. In some examples, about 90% of the semiconductor wafers in a group of 100 semiconductor wafers that have been subjected to a grinding operation using a grind disc according to examples of the present disclosure have an edge roll of less than 1 micron, such as less than 0.7 microns, such as less than 0.3 microns.

Figure 10:
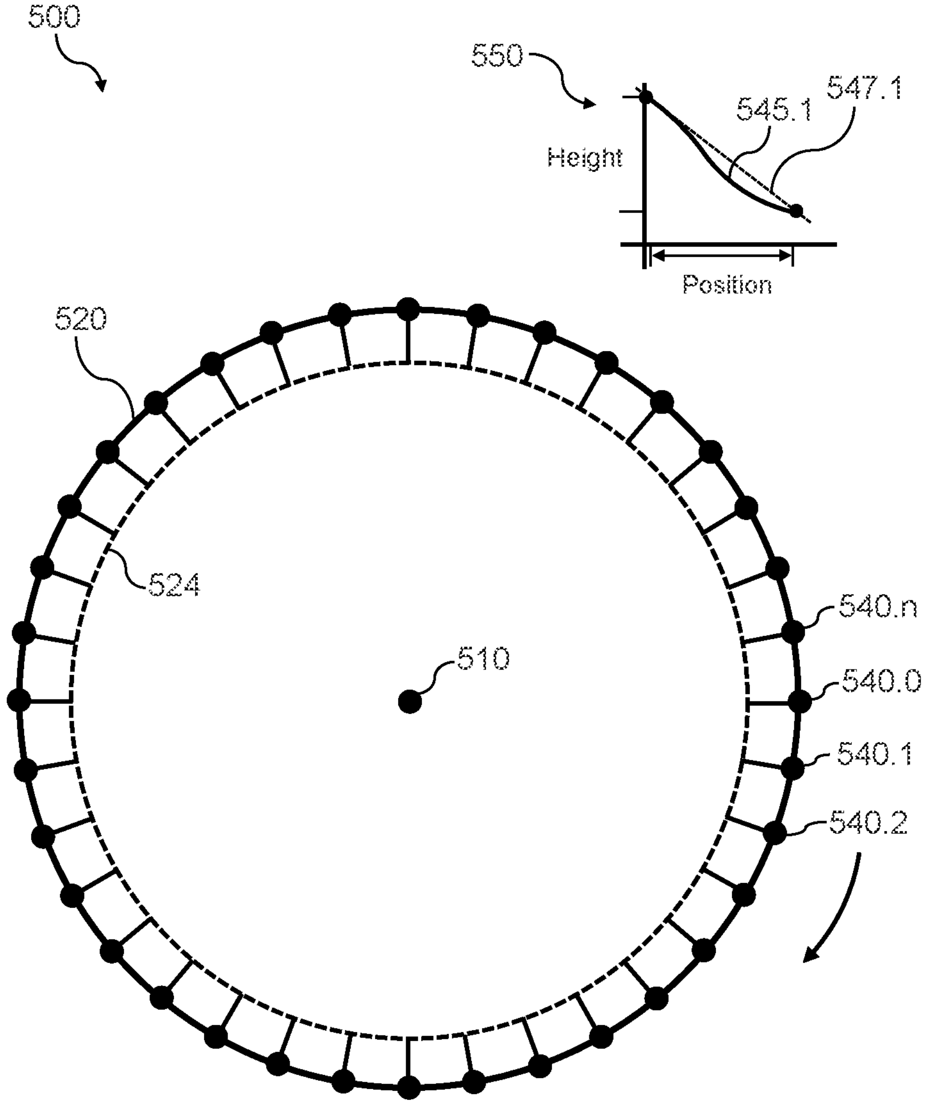
FIG. 10 depicts an example determination of edge roll for a semiconductor wafer according to examples of the present disclosure.

FIG. 10 depicts an example determination of edge roll for a semiconductor wafer 500 according to examples of the present disclosure. First, a plurality of edge profiles are obtained that provide flatness profiles for the semiconductor wafer 500 from a point at the boundary 524 of the edge roll region (e.g., 10 mm of the periphery of the semiconductor wafer) to the periphery 520 of the semiconductor wafer 500. The topographic surface profile for each edge profile provides the heights of semiconductor wafer 500 in a line from the periphery 520 of the semiconductor wafer 500 toward the center 510 of the semiconductor wafer 500 but stops at boundary 524 of the edge roll region. An edge profile 540.0, 540.1, 540.2, . . . 540.*n* may be obtained for each sampled cross-section about the azimuth of the semiconductor wafer 500 from 0° to 360°. A graphical representation of the edge profile 545.1 for sampled edge profile 540.1 is illustrated in the graph 550. The number of sampled edge profiles may be in a range of about 360 edge profiles to about 6400 edge profiles, such as about 3600 edge profiles (e.g., an edge profile for every 1/10 degree about the azimuth of the semiconductor wafer 500). A linear fit is determined for each sampled edge profile. An example linear fit 547.1 is provided for edge profile 545.1 in FIG. 10. The linear fit is subtracted from each sampled edge profile to determine a subtracted sampled edge profile. The difference between the minimum value and maximum value of the subtracted sampled edge profile defines the edge roll for the sampled edge profile. The maximum sampled edge roll for all sampled edge profiles about the azimuth of the semiconductor wafer 500 is the edge roll for the semiconductor wafer 500.

Figure 11:
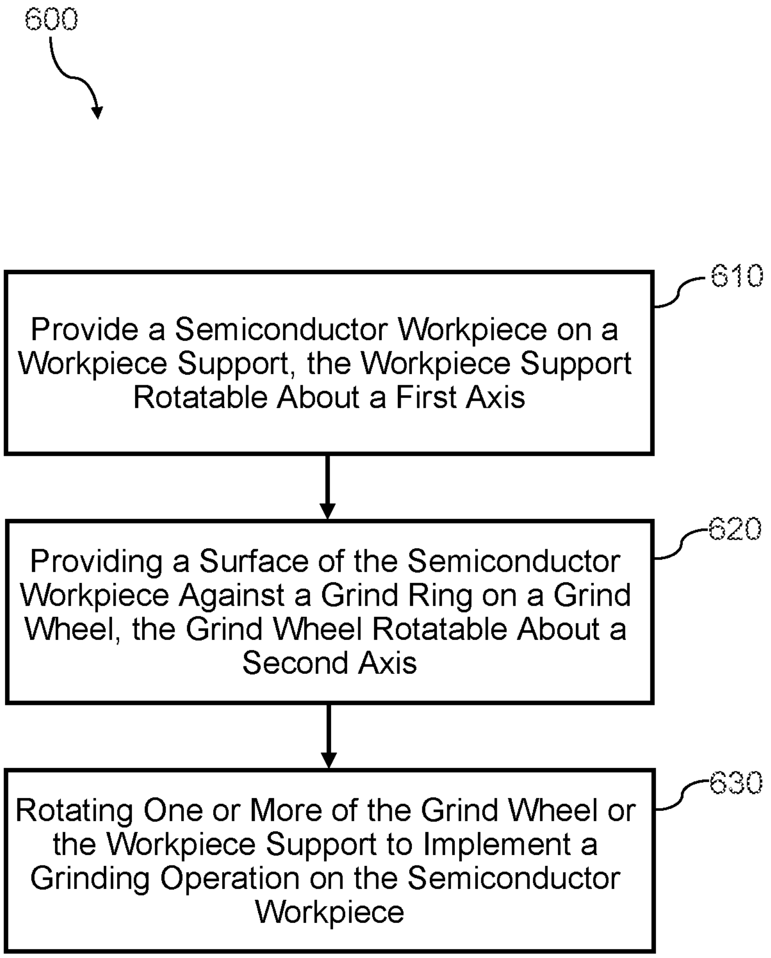
FIG. 11 depicts a flow chart of an example method according to example embodiments of the present disclosure.

FIG. 11 depicts a flow chart of an example method 600 according to example embodiments of the present disclosure. The method 600 may be implemented, for instance, using the grinding system 100 of FIG. 1. The method 600 depicts operations performed in a particular order for purposes of illustration and discussion. Those of ordinary skill in the art, using the disclosures provided herein, will understand that the operations of any of the methods described herein may be adapted, expanded, performed simultaneously, omitted, rearranged, include steps not illustrated, and/or modified in various ways without deviating from the scope of the present disclosure.

At 610, the method 600 may include providing a semiconductor workpiece on a workpiece support, the workpiece support being rotatable about a first axis. The semiconductor workpiece may be a silicon carbide semiconductor wafer or, at least partially, include silicon carbide. In some examples, the workpiece support may be part of a complete grinding system such as, for example, a Blanchard grinding system.

At 620, the method 600 may include providing a surface of the semiconductor workpiece against a grinding ring on a grind wheel, the grind wheel being rotatable about a second axis. The grinding ring may include a plurality of grinding teeth that, in combination, make up the grinding ring around a periphery of the grind wheel. Additionally, the grind wheel may include a variety of properties. For instance, the grinding ring may include a radius that is less than a radius of the semiconductor workpiece. In some embodiments, the grinding ring may include a radius that is greater than or equal to a radius of the semiconductor workpiece.

The plurality of grinding teeth may be arranged in a variety of ways according to examples of the present disclosure on the grind wheel. In some examples, the plurality of grinding teeth may include an effective gap ratio between each tooth that is about 0.8 or less at an edge of the semiconductor workpiece, such as 0.5 or less, or 0.1 or less. In some examples, the plurality of grinding teeth may form a first grinding ring and a second grinding ring that is arranged concentrically with the first grinding ring. Each grinding ring may include its own plurality of grinding teeth with distinct positions. For instance, the plurality of grinding teeth in the first grinding ring may be staggered relative to the plurality of grinding teeth in the second grinding ring. In some examples, the plurality of grinding teeth may include a grind surface and the grind surface may include a first edge and second edge that form an acute angle.

The plurality of grinding teeth may include varied materials and material properties. In some examples, the plurality of grinding teeth may be made of or, at least partially, include an abrasive containing material. For example, the plurality of grinding teeth may include an abrasive containing material including one or more abrasive elements. In some embodiments, the abrasive elements may include one or more of: (i) diamond; (ii) ceramic; (iii) metal nitride; (iv) metal oxide, (v) metal carbide; (vi) metalloid nitride; (vii) metalloid oxide; (viii) metalloid carbide; (ix) carbon group nitride; (x) carbon group oxide; or (xi) carbon group carbide.

At 630, the method 600 may include rotating one or more of the grind wheel or the workpiece support to implement a grinding operation on the semiconductor workpiece.

Figure 12:
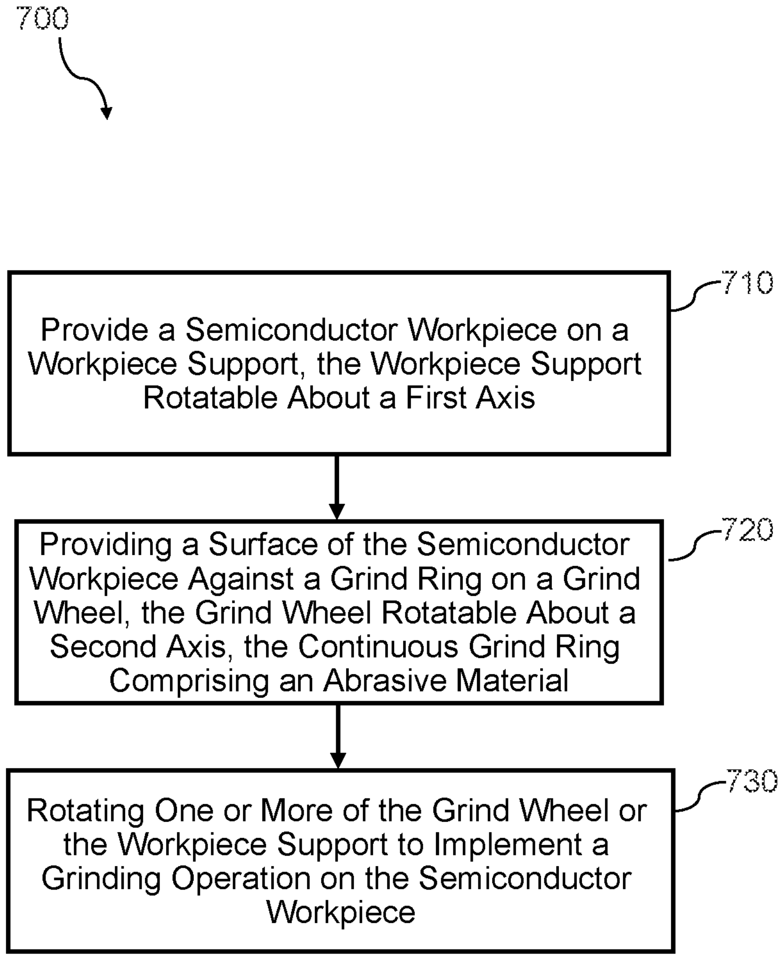
FIG. 12 depicts a flow chart of an example method according to example embodiments of the present disclosure.

FIG. 12 depicts a flow chart of an example method 700 according to example embodiments of the present disclosure. The method 700 may be implemented, for instance, using the grinding system 100 of FIG. 1. The method 700 depicts operations performed in a particular order for purposes of illustration and discussion. Those of ordinary skill in the art, using the disclosures provided herein, will understand that the operations of any of the methods described herein may be adapted, expanded, performed simultaneously, omitted, rearranged, include steps not illustrated, and/or modified in various ways without deviating from the scope of the present disclosure.

At 710, the method 700 includes providing a semiconductor workpiece on a workpiece support, the workpiece support rotatable about a first axis. The semiconductor workpiece may be a silicon carbide semiconductor wafer or, at least partially, include silicon carbide. In some examples, the workpiece support may be part of a complete grinding system such as, for example, a Blanchard grinding system.

At 720, the method 700 providing a surface of the semiconductor workpiece against a continuous grinding ring on a grind wheel, the grind wheel rotatable about a second axis, the continuous grinding ring comprising an abrasive containing material. In some examples, the abrasive containing material may include one or more abrasive elements. In some embodiments, the abrasive elements may include one or more of: (i) diamond; (ii) ceramic; (iii) metal nitride; (iv) metal oxide, (v) metal carbide; (vi) metalloid nitride; (vii) metalloid oxide; (viii) metalloid carbide; (ix) carbon group nitride; (x) carbon group oxide; or (xi) carbon group carbide. Additionally, in some examples, the radius of the continuous grinding ring may be less than the radius of the semiconductor workpiece.

The continuous grinding ring may be embodied through a variety of designs and design properties. In some examples, the continuous grinding ring may form a ring with no breaks or gaps. Additionally, or alternatively, the continuous grinding ring may include one or more holes with a diameter less than a width of the continuous grinding ring. In some examples, the continuous grinding ring may be a meandering grinding ring with one or more undulations.

At 730, the method 700 includes rotating one or more of the grind wheel or the workpiece support to implement a grinding operation on the semiconductor workpiece.

Figure 13:
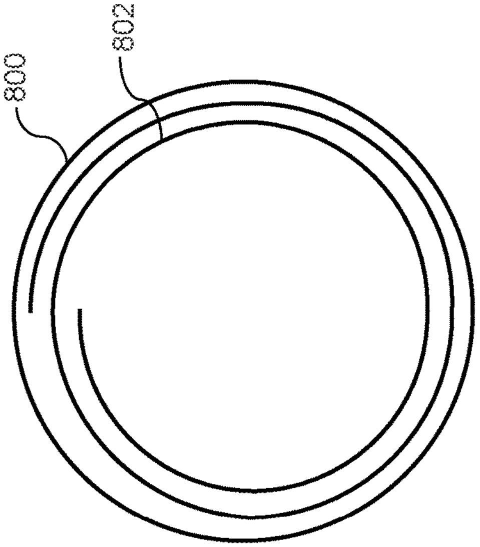
FIGS. 13-22 depict example grind wheels according to example embodiments of the present disclosure.

FIG. 13 depicts an example grind wheel 800 having a grind ring 802 according to example embodiments of the present disclosure. As illustrated in FIG. 13, the grind ring 802 is a continuous grind ring in a helical shape. The continuous grind ring 802 having the helical shape can have an abrasive-containing surface. The helical shape may run clockwise or counterclockwise. In some embodiments, the helical shape may be a double helix or a triple helix.

Figure 14:
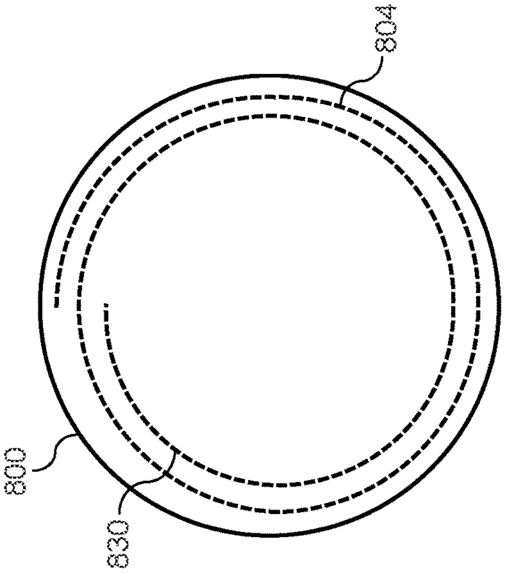

FIG. 14 depicts an example grind wheel 800 having a grind ring 804 having a plurality of grind teeth 830 according to example embodiments of the present disclosure. The plurality of grind teeth 830 are arranged in a helical pattern on the grind wheel 800. One or more of the grind teeth 830 may have an abrasive-containing surface.

Figure 15:
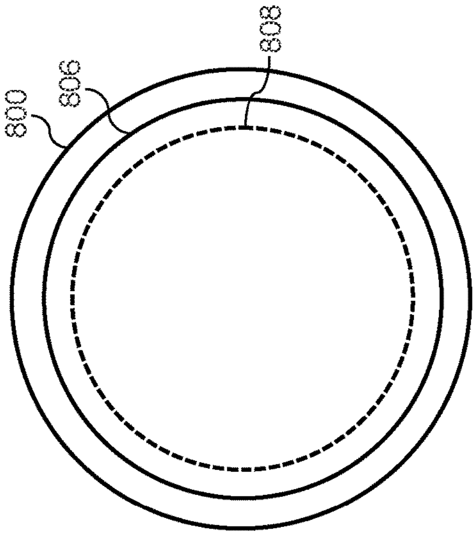

FIG. 15 depicts an example grind wheel 800 having a first grind ring 806 and a second grind ring 808 within the first grind ring 806. The first grind ring 806 can be a continuous grind ring 806 with an abrasive containing surface. The second grind ring 808 can have a plurality of grind teeth 830. One or more of the plurality of grind teeth 830 may have an abrasive containing surface. In some embodiments (not illustrated), the first grind ring 806 can have a plurality of grind teeth and the second grind ring 808 can be a continuous grind ring.

Figure 16:
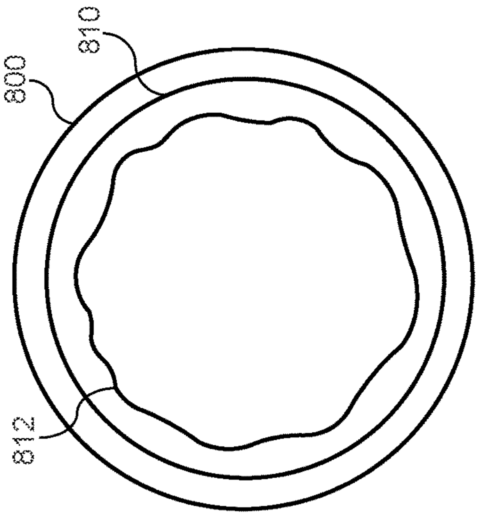

FIG. 16 depicts an example grind wheel 800 having a first grind ring 810 and a second grind ring 812 within the first grind ring 810. The first grind ring 810 can be a continuous grind ring 810 with an abrasive containing surface. The second grind ring 812 can be a continuous grind ring 812 with abrasive-containing surface. As illustrated, the first grind ring 810 and the second grind ring 812 may have different shapes.

Figure 17:
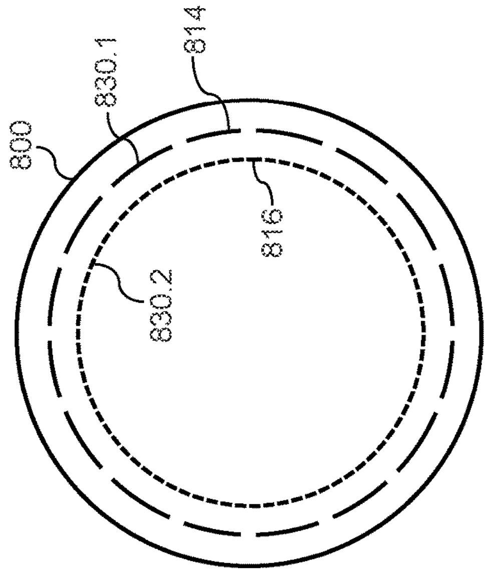

FIG. 17 depicts an example grind wheel 800 having a first grind ring 814 and a second grind ring 816 within the first grind ring 814. The first grind ring 814 can have a plurality of grind teeth 830.1. One or more of the grind teeth 830.1 may have an abrasive-containing surface. The second grind ring 816 can have a plurality of grind teeth 830.2. One or more of the grind teeth 830.2 may have an abrasive-containing surface. In some examples, the size of the grind teeth 830.1 in the first grind ring 814 may be different from a size of the grind teeth 830.2 in the second grind ring 816. In some examples, the spacing between the grind teeth 830.1 in the first grind ring 814 may be different from a spacing between the grind teeth 830.2 in the second grind ring 816.

Figure 18:
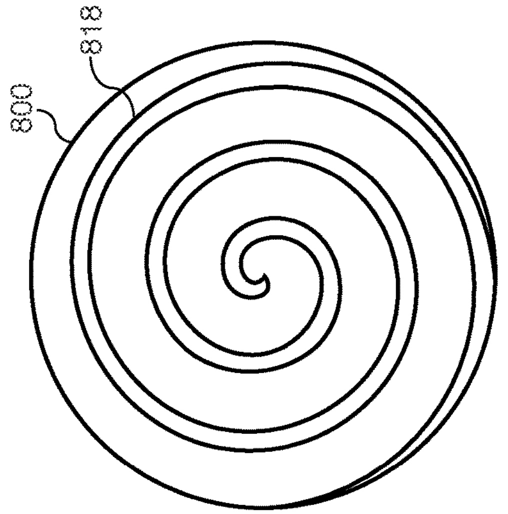

FIG. 18 depicts an example grind wheel 800 having a grind ring 818 according to example embodiments of the present disclosure. As illustrated in FIG. 18, the grind ring 818 is a continuous grind ring that spirals outward at least partially from a center region of the grind wheel 800. The continuous grind ring 818 can have an abrasive-containing surface.

Figure 19:
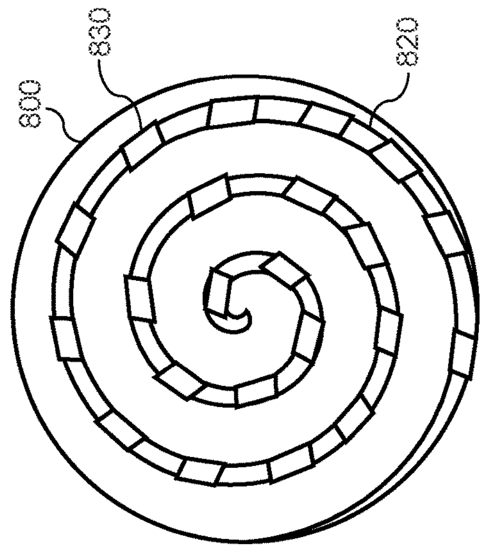

FIG. 19 depicts an example grind wheel 800 having a grind ring 820 having a plurality of grind teeth 830 according to example embodiments of the present disclosure. The plurality of grind teeth 830 are arranged in a pattern that spirals outward at least partially from a center region of the grind wheel 800. One or more of the grind teeth 830 may have an abrasive-containing surface.

Figure 20:
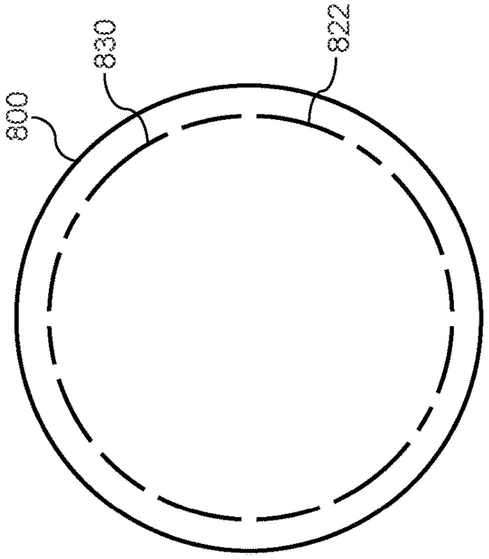

FIG. 20 depicts a grind wheel 800 having a grind ring 822 having a plurality of grind teeth 830 according to example embodiments of the present disclosure. The plurality of grind teeth 830 are spaced apart in an irregular pattern (e.g., without regular spacing). Two or more of the plurality of grind teeth 830 may each have different sizes. One or more of the grind teeth 830 may have an abrasive-containing surface.

Figure 21:
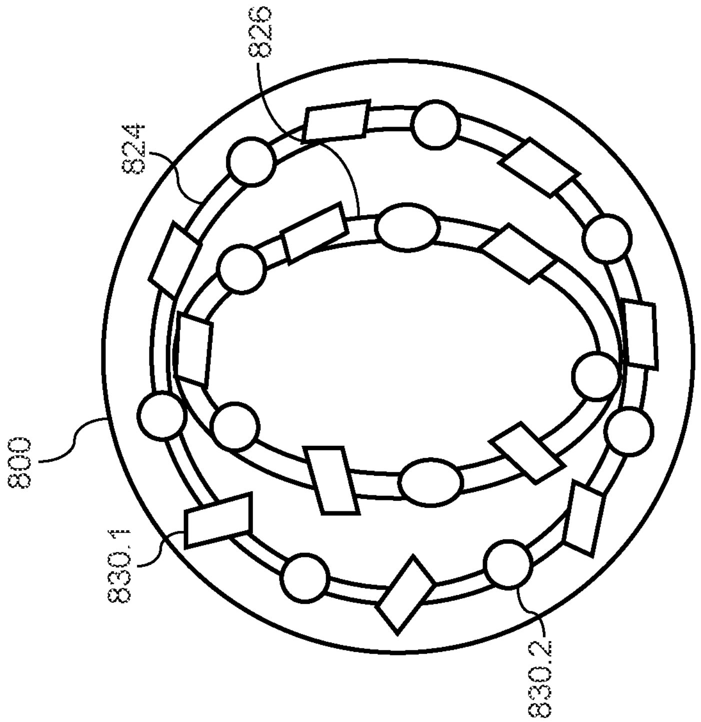

FIG. 21 depicts a grind wheel 800 having a first grind ring 824 and a second grind ring 826 within the first grind ring 824. The first grind ring 824 can have a plurality of grind teeth 830.1 and a plurality of grind teeth 830.2 in a circular ring. The grind teeth 830.1 and grind teeth 830.2 may have different shapes. One or more of the grind teeth 830.1 and the grind teeth 830.2 may have an abrasive-containing surface. The second grind ring 826 can have a plurality of grind teeth 830.1 and a plurality of grind teeth 830.2 in an oval ring. The grind teeth 830.1 and grind teeth 830.2 may have different shapes. One or more of the grind teeth 830.1 and 830.2 may have an abrasive-containing surface.

Figure 22:
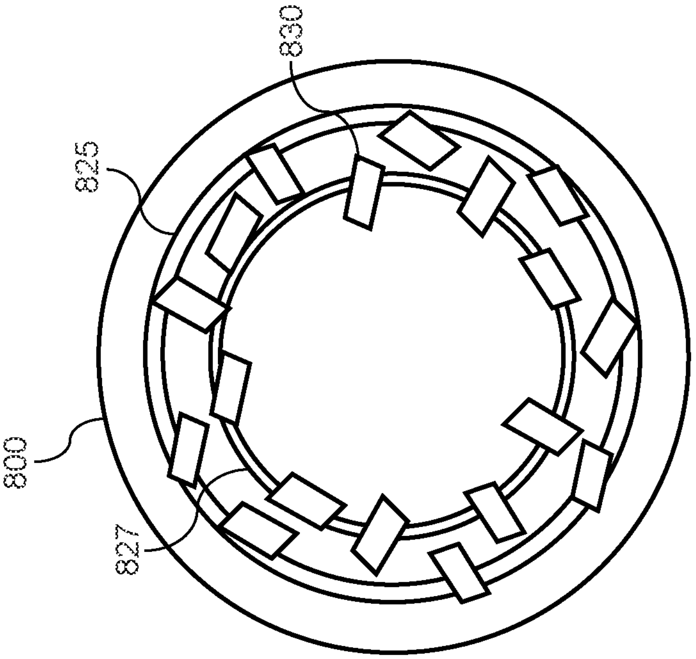

FIG. 22 depicts a grind wheel having a first grind ring 825 and a second grind ring 827 within the first grind ring 825. The first grind ring 825 can have a plurality of grind teeth 830. One or more of the grind teeth 830 may have an abrasive-containing surface. The second grind ring 827 can have a plurality of grind teeth 830. The grind teeth 830 in both the first grind ring 825 and the second grind ring 827 may have different spacing, size, and/or orientations relative to one another, for instance, in an irregular or random distribution.

One example aspect of the present disclosure is directed to a grinding system for a semiconductor workpiece. The grinding system includes a workpiece support operable to support a semiconductor workpiece and rotate the semiconductor workpiece about a first axis. The grinding system further includes a grind wheel operable to rotate about a second axis. The grind wheel has a plurality of grinding teeth arranged in a grinding ring on the grind wheel. A radius of the grinding ring is less than or equal to a radius of the semiconductor workpiece.

In some examples, a ratio of the radius of the semiconductor workpiece to the radius of the grinding ring is in a range of about 1.1 to about 2.0.

In some examples, a ratio of the radius of the semiconductor workpiece to the radius of the grinding ring is in a range of about 1.5 to about 2.0.

In some examples, the radius of the grinding ring is such that an effective gap ratio between the plurality of grinding teeth at an edge of the semiconductor workpiece is about 0.8 or less.

In some examples, the radius of the grinding ring is such that an effective gap ratio between the plurality of grinding teeth at an edge of the semiconductor workpiece is about 0.5 or less.

In some examples, the radius of the grinding ring is such that an effective gap ratio between the plurality of grinding teeth at an edge of the semiconductor workpiece is about 0.1 or less.

In some examples, the grind wheel is positioned such that the grinding ring at least partially overlaps a center of the workpiece support.

In some examples, the grinding system further comprises a translation stage configured to move the grind wheel relative to the workpiece support.

In some examples, each of the plurality of grinding teeth comprises a grind surface, the grind surface having a first edge and a second edge forming an acute angle.

In some examples, the acute angle is in a range of 1° to 60°.

In some examples, the acute angle is in a range of 30° to 45°.

In some examples, the grind surface has a parallelogram shape.

In some examples, the grind wheel comprises a second grinding ring that is arranged within the grinding ring. The second grinding ring includes a plurality of second grinding teeth.

In some examples, the plurality of grinding teeth of the grinding ring are staggered relative to the plurality of second grinding teeth of the second grinding ring.

In some examples, each of the plurality of grinding teeth comprise an abrasive containing material.

In some examples, the abrasive containing material comprises one or more of: (i) diamond; (ii) ceramic; (iii) metal nitride; (iv) metal oxide, (v) metal carbide; (vi) metalloid nitride; (vii) metalloid oxide; (viii) metalloid carbide; (ix) carbon group nitride; (x) carbon group oxide; or (xi) carbon group carbide.

In some examples, the grinding system is a Blanchard grinding system.

In some examples, the semiconductor workpiece comprises silicon carbide.

Another example aspect of the present disclosure is directed to a grinding system for a semiconductor workpiece. The grinding system includes a workpiece support operable to support a semiconductor workpiece and rotate the semiconductor workpiece about a first axis. The grinding system further includes a grind wheel operable to rotate about a second axis. The grind wheel has a plurality of grinding teeth arranged in a grinding ring on the grind wheel. Each of the plurality of grinding teeth comprises a grind surface, the grind surface having a first edge and a second edge forming an acute angle.

In some examples, the acute angle is in a range of 1° to 60°.

In some examples, the acute angle is in a range of 30° to 45°.

In some examples, the grind surface has a parallelogram shape.

In some examples, the grind wheel comprises a second grinding ring that is arranged within the grinding ring. The second grinding ring includes a plurality of second grinding teeth.

In some examples, the plurality of grinding teeth of the grinding ring are staggered relative to the plurality of second grinding teeth of the second grinding ring.

In some examples, each of the plurality of grinding teeth comprise an abrasive containing material.

In some examples, the abrasive containing material comprises one or more of: (i) diamond; (ii) ceramic; (iii) metal nitride; (iv) metal oxide, (v) metal carbide; (vi) metalloid nitride; (vii) metalloid oxide; (viii) metalloid carbide; (ix) carbon group nitride; (x) carbon group oxide; or (xi) carbon group carbide.

In some examples, the grinding system is a Blanchard grinding system.

In some examples, the semiconductor workpiece comprises silicon carbide.

Another example aspect of the present disclosure is directed to a grinding system for a semiconductor workpiece. The grinding system includes a workpiece support operable to support a semiconductor workpiece and rotate the semiconductor workpiece about a first axis. The grinding system further includes a grind wheel operable to rotate about a second axis, wherein the grind wheel has a continuous grinding ring on the grind wheel, the continuous grinding ring comprising an abrasive containing material.

In some examples, the continuous grinding ring forms a ring with no breaks.

In some examples, the continuous grinding ring comprises one or more holes in the grinding ring, each hole having a diameter that is smaller than a width of the grinding ring.

In some examples, the continuous grinding ring is a meandering grinding ring with one or more undulations.

In some examples, the continuous grinding ring has a radius that is less than or equal to a radius of the semiconductor workpiece.

In some examples, the abrasive containing material comprises one or more of: (i) diamond; (ii) ceramic; (iii) metal nitride; (iv) metal oxide, (v) metal carbide; (vi) metalloid nitride; (vii) metalloid oxide; (viii) metalloid carbide; (ix) carbon group nitride; (x) carbon group oxide; or (xi) carbon group carbide.

In some examples, the grinding system is a Blanchard grinding system.

In some examples, the semiconductor workpiece comprises silicon carbide.

Another example aspect of the present disclosure is directed to a grinding system for a semiconductor workpiece. The grinding system includes a workpiece support operable to support a semiconductor workpiece and rotate the semiconductor workpiece about a first axis. The grinding system further includes a grind wheel operable to rotate about a second axis, wherein the grind wheel has a plurality of grinding teeth arranged in a grinding ring on the grind wheel. An effective gap ratio between the plurality of grinding teeth at an edge of the semiconductor workpiece is about 0.8 or less.

In some examples, the effective gap ratio between the plurality of grinding teeth at an edge of the semiconductor workpiece is about 0.5 or less.

In some examples, the effective gap ratio between the plurality of grinding teeth at an edge of the semiconductor workpiece is about 0.1 or less.

In some examples, a radius of the grinding ring is less than a radius of the semiconductor workpiece.

In some examples, each of the plurality of grinding teeth comprises a grind surface, the grind surface having a first edge and a second edge forming an acute angle.

In some examples, the grind wheel comprises a second grinding ring that is arranged within the grinding ring. The second grinding ring includes a plurality of second grinding teeth.

In some examples, the plurality of grinding teeth of the grinding ring are staggered relative to the plurality of second grinding teeth of the second grinding ring.

In some examples, each of the plurality of grinding teeth comprise an abrasive containing material.

In some examples, the abrasive containing material comprises one or more of: (i) diamond; (ii) ceramic; (iii) metal nitride; (iv) metal oxide, (v) metal carbide; (vi) metalloid nitride; (vii) metalloid oxide; (viii) metalloid carbide; (ix) carbon group nitride; (x) carbon group oxide; or (xi) carbon group carbide.

In some examples, the grinding system is a Blanchard grinding system.

In some examples, the semiconductor workpiece comprises silicon carbide.

Another example aspect of the present disclosure is directed to a method for grinding a surface of a semiconductor workpiece. The method includes providing a semiconductor workpiece on a workpiece support, the workpiece support rotatable about a first axis. The method further includes providing a surface of the semiconductor workpiece against a grinding ring on a grind wheel, the grind wheel rotatable about a second axis. The method further includes rotating one or more of the grind wheel or the workpiece support to implement a grinding operation on the semiconductor workpiece. An effective gap ratio between a plurality of grinding teeth at an edge of the semiconductor workpiece is about 0.8 or less.

In some examples, the effective gap ratio between the plurality of grinding teeth at an edge of the semiconductor workpiece is about 0.5 or less.

In some examples, the effective gap ratio between the plurality of grinding teeth at an edge of the semiconductor workpiece is about 0.1 or less.

In some examples, a radius of the grinding ring is less than a radius of the semiconductor workpiece.

In some examples, each of the plurality of grinding teeth comprises a grind surface, the grind surface having a first edge and a second edge forming an acute angle.

In some examples, the grind wheel comprises a second grinding ring that is arranged within the grinding ring. The second grinding ring includes a plurality of second grinding teeth.

In some examples, the plurality of grinding teeth of the grinding ring are staggered relative to the plurality of second grinding teeth of the second grinding ring.

In some examples, each of the plurality of grinding teeth comprise an abrasive containing material.

In some examples, the abrasive containing material comprises one or more of: (i) diamond; (ii) ceramic; (iii) metal nitride; (iv) metal oxide, (v) metal carbide; (vi) metalloid nitride; (vii) metalloid oxide; (viii) metalloid carbide; (ix) carbon group nitride; (x) carbon group oxide; or (xi) carbon group carbide.

In some examples, the grind wheel is part of a Blanchard grinding system.

In some examples, the semiconductor workpiece comprises silicon carbide.

Another example aspect of the present disclosure is directed to a method for grinding a surface of a semiconductor workpiece. The method includes providing a semiconductor workpiece on a workpiece support, the workpiece support rotatable about a first axis. The method further includes providing a surface of the semiconductor workpiece against a continuous grinding ring on a grind wheel, the grind wheel rotatable about a second axis, the continuous grinding ring comprising an abrasive containing material. The method further includes rotating one or more of the grind wheel or the workpiece support to implement a grinding operation on the semiconductor workpiece.

In some examples, the continuous grinding ring forms a ring with no breaks.

In some examples, the continuous grinding ring comprises one or more holes in the grinding ring. Each hole has a diameter that is smaller than a width of the grinding ring.

In some examples, the continuous grinding ring is a meandering grinding ring with one or more undulations.

In some examples, the continuous grinding ring has a radius that is less than or equal to a radius of the semiconductor workpiece.

In some examples, the abrasive containing material comprises one or more of: (i) diamond; (ii) ceramic; (iii) metal nitride; (iv) metal oxide, (v) metal carbide; (vi) metalloid nitride; (vii) metalloid oxide; (viii) metalloid carbide; (ix) carbon group nitride; (x) carbon group oxide; or (xi) carbon group carbide.

In some examples, the grind wheel is part of a Blanchard grinding system.

In some examples, the semiconductor workpiece comprises silicon carbide.

Another example aspect of the present disclosure is directed to a Blanchard ground semiconductor wafer, comprising a silicon carbide surface. The semiconductor wafer has an edge roll over 10 millimeters from a peripheral edge of the semiconductor wafer of less than about 0.7 microns.

In some examples, the semiconductor wafer has an edge roll over 10 millimeters from a peripheral edge of the semiconductor wafer of less than about 0.3 microns.

In some examples, a diameter of the semiconductor wafer is about 150 millimeters. In some examples, a diameter of the semiconductor wafer is about 200 millimeters.

In some examples, a diameter of the semiconductor wafer is about 100 millimeters.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A grinding system for a semiconductor workpiece, the grinding system comprising:

a workpiece support operable to support a semiconductor workpiece and rotate the semiconductor workpiece about a first axis; and a grind wheel operable to rotate about a second axis, wherein the grind wheel has a plurality of first grinding teeth arranged in a first grinding ring on the grind wheel;

wherein a radius of the first grinding ring is such that grind wheel comprises an effective gap ratio when the plurality of first grinding teeth are contacting an edge of the semiconductor workpiece of about 0.8 or less, wherein the effective gap ratio comprises a ratio of an effective gap measurement between the plurality of first grinding teeth to an actual gap measurement between the plurality of first grinding teeth, wherein the effective gap measurement is a distance between a last point of a grinding tooth of the plurality of first grinding teeth contacting an edge of the semiconductor workpiece and a first point of an adjacent grinding tooth of the plurality of first grinding teeth contacting the edge of the semiconductor workpiece in a rotational direction of the grind wheel.

2. The grinding system of claim 1, wherein the grind wheel is positioned such that the first grinding ring at least partially overlaps a center of the workpiece support.

3. The grinding system of claim 1, wherein each of the plurality of first grinding teeth comprises a grind surface, the grind surface having a first edge and a second edge forming an acute angle.

4. The grinding system of claim 3, wherein the acute angle is in a range of 1° to 60°.

5. The grinding system of claim 3, wherein the grind surface has a parallelogram shape.

6. The grinding system of claim 1, wherein the grind wheel comprises a second grinding ring that is arranged within the first grinding ring, the second grinding ring comprising a plurality of second grinding teeth.

7. The grinding system of claim 6, wherein the plurality of first grinding teeth of the first grinding ring are staggered relative to the plurality of second grinding teeth of the second grinding ring.

8. The grinding system of claim 1, wherein each of the plurality of first grinding teeth comprise an abrasive containing material.

9. The grinding system of claim 1, wherein the semiconductor workpiece comprises silicon carbide.

10. The grinding system of claim 1, wherein the radius of the first grinding ring is such that the effective gap ratio when the plurality of first grinding teeth are contacting the edge of the semiconductor workpiece is about 0.5 or less.

11. The grinding system of claim 1, wherein the radius of the first grinding ring is such that the effective gap ratio when the plurality of first grinding teeth are contacting the edge of the semiconductor workpiece is about 0.1 or less.

12. A method for grinding a surface of a semiconductor workpiece, comprising:

providing a semiconductor workpiece on a workpiece support, the workpiece support rotatable about a first axis;

providing a surface of the semiconductor workpiece against a first grinding ring on a grind wheel, the grind wheel rotatable about a second axis; and rotating one or more of the grind wheel or the workpiece support to implement a grinding operation on the semiconductor workpiece;

wherein an effective gap ratio when a plurality of grinding teeth are contacting an edge of the semiconductor workpiece is about 0.8 or less, wherein the effective gap ratio comprises a ratio of an effective gap measurement between the plurality of grinding teeth to an actual gap measurement between the plurality of grinding teeth, wherein the effective gap measurement is a distance between a last point of a grinding tooth of the plurality of grinding teeth contacting an edge of the semiconductor workpiece and a first point of an adjacent grinding tooth of the plurality of grinding teeth contacting the edge of the semiconductor workpiece in a rotational direction of the grind wheel.

13. The method of claim 12, wherein a radius of the first grinding ring is less than a radius of the semiconductor workpiece.

14. The method of claim 12, wherein each of the plurality of grinding teeth comprises a grind surface, the grind surface having a first edge and a second edge forming an acute angle.

15. The method of claim 12, wherein the grind wheel comprises a second grinding ring that is arranged within the first grinding ring, the second grinding ring comprising a plurality of second grinding teeth.

16. The method of claim 12, wherein each of the plurality of grinding teeth comprise an abrasive containing material.

17. The method of claim 12, wherein the semiconductor workpiece comprises silicon carbide.

18. The method of claim 12, wherein the effective gap ratio when the plurality of grinding teeth are contacting the edge of the semiconductor workpiece is about 0.5 or less.

19. The method of claim 12, wherein the effective gap ratio when the plurality of grinding teeth are contacting the edge of the semiconductor workpiece is about 0.1 or less.

* * * * *